(12) United States Patent
Lin et al.

(10) Patent No.: US 12,255,095 B2
(45) Date of Patent: *Mar. 18, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Yu-Kai Lin, Changhua County (TW); Su-Jen Sung, Hsinchu County (TW); Tze-Liang Lee, Hsinchu (TW); Jen-Hung Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/310,527

(22) Filed: May 1, 2023

(65) Prior Publication Data

US 2023/0274975 A1    Aug. 31, 2023

Related U.S. Application Data

(63) Continuation of application No. 17/192,805, filed on Mar. 4, 2021, now Pat. No. 11,670,546.

(51) Int. Cl.
*H01L 21/768* (2006.01)
*H01L 21/311* (2006.01)
(Continued)

(52) U.S. Cl.
CPC .. *H01L 21/76832* (2013.01); *H01L 21/31116* (2013.01); *H01L 21/31144* (2013.01);
(Continued)

(58) Field of Classification Search
CPC ......... H01L 21/76832; H01L 21/31116; H01L 21/31144; H01L 21/76802;
(Continued)

(56) References Cited

U.S. PATENT DOCUMENTS

2015/0118842 A1*  4/2015  Lee ................... H01L 21/0223
                                                       438/652

\* cited by examiner

*Primary Examiner* — Karen Kusumakar
(74) *Attorney, Agent, or Firm* — JCIPRNET

(57) ABSTRACT

A semiconductor structure including a substrate, a first dielectric layer, a first conductive feature, an etch stop layer, a second dielectric layer and a second conductive feature is provided. The first dielectric layer is disposed over the substrate. The first conductive feature is disposed in the first dielectric layer. The etch stop layer is disposed over the first dielectric layer and the first conductive feature, wherein the etch stop layer comprises a metal-containing layer and a silicon-containing layer, the metal-containing layer is located between the first dielectric layer and the silicon-containing layer, the metal-containing layer comprises a nitride-containing region and an oxide-containing region, and the nitride-containing region contacts the first conductive feature. The second dielectric layer is disposed over the etch stop layer. The second conductive feature penetrates the second dielectric layer and electrically connects with the first conductive feature.

20 Claims, 18 Drawing Sheets

(51) Int. Cl.
  *H01L 23/522* (2006.01)
  *H01L 23/532* (2006.01)
(52) U.S. Cl.
  CPC .. *H01L 21/76802* (2013.01); *H01L 21/76826* (2013.01); *H01L 21/76828* (2013.01); *H01L 21/76843* (2013.01); *H01L 21/76877* (2013.01); *H01L 23/5226* (2013.01); *H01L 23/53238* (2013.01)
(58) Field of Classification Search
  CPC ......... H01L 21/76826; H01L 21/76828; H01L 21/76843; H01L 21/76877; H01L 23/5226; H01L 23/53238
  See application file for complete search history.

SEMICONDUCTOR STRUCTURE AND MANUFACTURING METHOD THEREOF

CROSS-REFERENCE TO RELATED APPLICATION

This application is a continuation application of and claims the priority benefit of U.S. application Ser. No. 17/192,805, filed on Mar. 4, 2021, now allowed. The entirety of the above-mentioned patent application is hereby incorporated by reference herein and made a part of this specification.

BACKGROUND

As the semiconductor industry introduces new generations of integrated circuits (ICs) having higher performance and greater functionality, the density of the elements that form the ICs is increased, while the dimensions and spacing between components or elements of the ICs are reduced. The structure of metal wiring layers also becomes complex and minimized. To fabricate the metal wiring layers, a damascene process has been used together with an etch stop layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
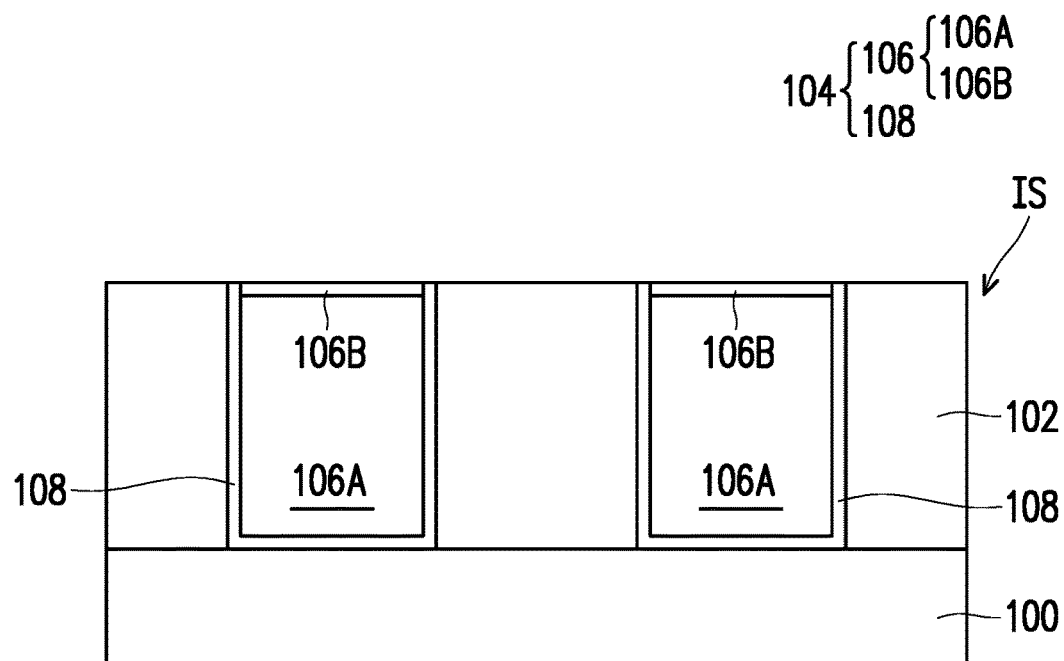
FIG. 1A to FIG. 1J are schematic cross-sectional views of various stages in a manufacturing method of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The semiconductor structures 10, 20, 30, 40 and 50 are provided for illustration purposes and do not necessarily limit the embodiments of the present disclosure to any number of devices, any number of regions, or any configuration of structures or regions. Furthermore, each of the semiconductor structures 10, 20, 30, 40 and 50 may be an intermediate structure fabricated during processing of a device (e.g., an IC) or a portion thereof, that may comprise static random access memory (SRAM) and/or logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 1B:
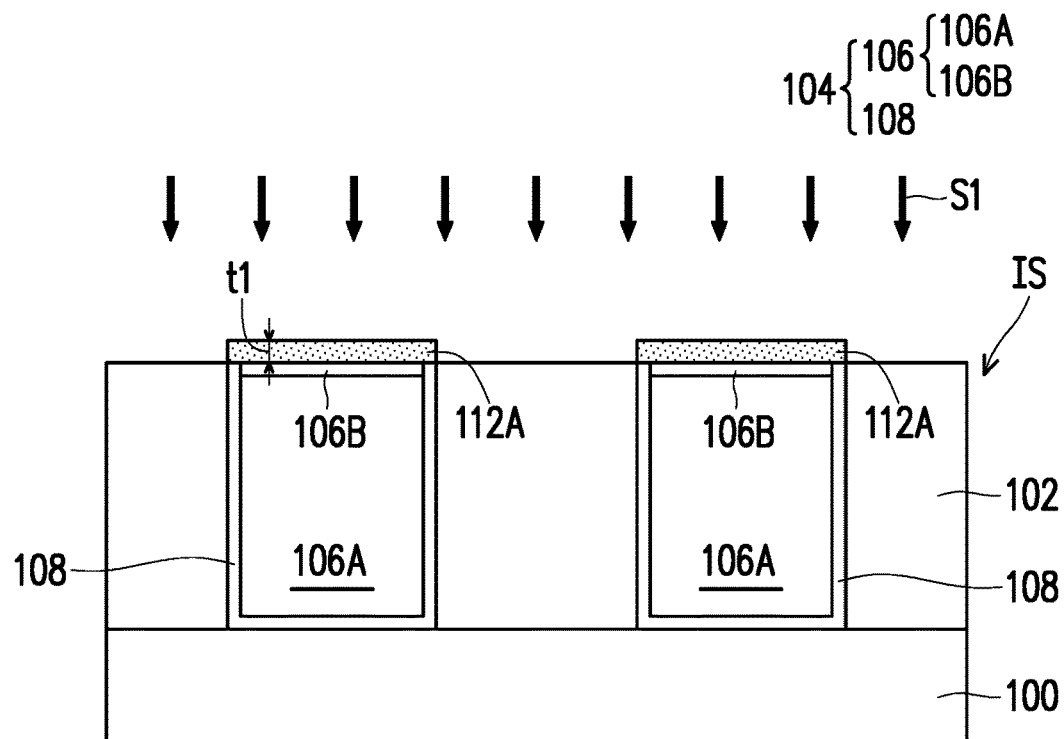
Figure 1C:
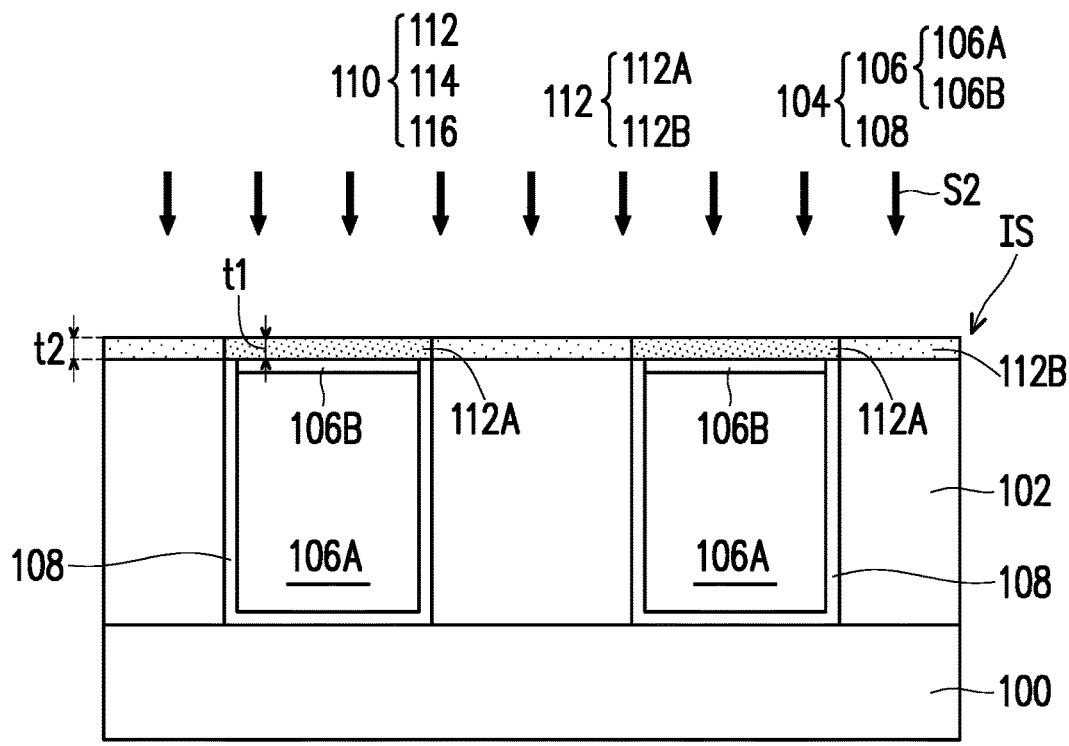

FIG. 1A to FIG. 1J are schematic cross-sectional views of various stages in a manufacturing method of a semiconductor structure 10 in accordance with some embodiments of the present disclosure. FIG. 2A is a schematic top view of the semiconductor structure 10 in the stage of FIG. 1A in accordance with some embodiments of the disclosure. FIG. 2B is a schematic top view of the semiconductor structure 10 in the stage of FIG. 1B in accordance with some embodiments of the disclosure. FIG. 2C is a schematic top view of the semiconductor structure 10 in the stage of FIG. 1C in accordance with some embodiments of the disclosure. Specifically, FIG. 1A is a cross-sectional view taken along the line I-I' of FIG. 2A, FIG. 1B is a cross-sectional view taken along the line I-I' of FIG. 2B, and FIG. 1C is a cross-sectional view taken along the line I-I' of FIG. 2C.

Referring to FIG. 1A, a substrate 100 is provided. In some embodiments, the substrate 100 may be a semiconductor substrate (e.g., a wafer). In some embodiments, the substrate 100 may be made of elemental semiconductor materials such as crystalline silicon, diamond, or germanium; compound semiconductor materials such as silicon carbide, gallium arsenic, gallium phosphide, indium arsenide, indium phosphide, or indium antimonide; or alloy semiconductor materials such as silicon germanium, silicon germanium carbide, gallium arsenic phosphide, or gallium indium phosphide. In some embodiments, the substrate 100 may include active components (e.g., p-type field effect transistors (PFET), n-type FET (NFET), metal-oxide semiconductor field effect transistors (MOSFET), complementary metal-oxide semiconductor (CMOS) transistors, bipolar transistors, high voltage transistors, and/or high frequency transistors) and optionally passive components (e.g., resistors, capacitors, inductors or the like) formed therein. However, the disclosure is not limited thereto. In some alternative embodiments, the substrate 100 may be a bulk semiconductor material. For example, the substrate 100 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof.

Referring to both of FIG. 1A and FIG. 2A, a dielectric layer 102 is formed over the substrate 100, and a conductive layer structure 104 is formed in the dielectric layer 102. In some embodiments, the dielectric layer 102 may be made of a low-k dielectric material. In some embodiments, the low-k dielectric material is generally a dielectric material having a dielectric constant (k-value) lower than about 4.5. For example, the dielectric layer 102 may be made of a low-k dielectric material having a k-value lower than about 2.3, which is sometimes referred to as an extra low-k (ELK) dielectric material. Examples of the low-k dielectric material may include tetraethylorthosilicate (TEOS) oxide (i.e., silicon oxide ($SiO_2$) formed from TEOS), un-doped silicate glass, or doped silicon oxide such as borophosphosilicate glass (BPSG), fused silica glass (FSG), phosphosilicate glass (PSG), boron doped silicon glass (BSG). In some embodiments, the dielectric layer 102 may be formed by suitable fabrication techniques such as spin-on coating, chemical vapor deposition (CVD), low pressure chemical vapor deposition (LPCVD), plasma enhanced chemical vapor deposition (PECVD), high density plasma chemical vapor deposition (HDPCVD), flowable chemical vapor deposition (FCVD), atomic layer chemical vapor deposition (ALCVD) or physical vapor deposition (PVD). As shown in FIG. 1A, the dielectric layer 102 is illustrated as a bulky layer, but the disclosure is not limited thereto. In some alternative embodiments, the dielectric layer 102 may be constituted by multiple dielectric layers.

In some embodiments, the conductive layer structure 104 may include multiple conductive features 106 and multiple barrier layers 108. As shown in FIG. 1A and FIG. 2A, the barrier layer 108 is located between the corresponding conductive feature 106 and the dielectric layer 102, and the dielectric layer 102 covers the side surfaces and the illustrated bottom surfaces of the barrier layers 108. That is to say, the conductive layer structure 104 and the barrier layers 108 are embedded in the dielectric layer 102 and surrounded by the dielectric layer 102. In other words, the barrier layers 108 are separated from each other by the dielectric layer 102, and the conductive features 106 are separated from each other by the barrier layers 108 and the dielectric layer 102. Although FIG. 1A illustrates that the conductive layer structure 104 includes the conductive features 106 and the barrier layers 108, the disclosure is not limited thereto. In some alternative embodiments, the conductive layer structure 104 includes the conductive features 106, but does not include barrier layers. In such case, the dielectric layer 102 is in direct contact with the conductive features 106. The number of the conductive features 106 may be less than or more than what is depicted in FIG. 1A and FIG. 2A, and may be designated based on the demand and/or design layout; the disclosure is not specifically limited thereto. As shown in FIG. 2A, the conductive feature 106 is formed to have a rectangle top-view shape. However, the disclosure is not limited thereto. In some alternative embodiments, the conductive feature 106 may exhibit a round shape, other polygonal shape or other suitable shapes from the top view.

In some embodiments, the conductive feature 106 may include a body layer 106A and a capping layer 106B over the body layer 106A. In some embodiments, the body layer 106A may be formed of copper (Cu), Cu alloy or other suitable metals. In some embodiments, the body layer 106A may be formed by suitable fabrication techniques such as sputtering, CVD or plating (e.g., electroplating or electro-less plating). In certain embodiments, the body layer 106A may be formed by a damascene process, such as a single damascene process. In some embodiments, the capping layer 106B functions as a Cu diffusion barrier. In some embodiments, the capping layer 106B may be formed of cobalt (Co), nickel (Ni), ruthenium (Ru), molybdenum (Mo), CoWP, NiMoP or other suitable materials. In some embodiments, the capping layer 106B may be formed by suitable fabrication techniques such as sputtering, CVD or plating (e.g., electroplating or electro-less plating). As shown in FIG. 1A, the illustrated top surface of the body layer 106A and the illustrated top surface of the capping layer 106B are planar surfaces, and the illustrated top surface of the capping layer 106B is substantially flush or coplanar with the illustrated top surface of the dielectric layer 102 and the illustrated top surface of the barrier layer 108. However, the disclosure is not limited thereto. In some alternative embodiments, the illustrated top surface of the body layer 106A and the illustrated top surface of the capping layer 106B may be curved surfaces (e.g. convex surfaces) from the illustrated top surface of the dielectric layer 102. That is, the illustrated top surface of the body layer 106A and the illustrated top surface of the capping layer 106B are not planar, and a portion of the capping layer 106B protrudes from and is higher than the illustrated top surface of the dielectric layer 102 and the illustrated top surface of the barrier layer 108.

In some embodiments, the conductive features 106 are part of an interconnect structure IS of the semiconductor structure 10. In view of this, the dielectric layer 102 may be referred to as an interlayer dielectric layer. In an embodiment, the conductive features 106 are contacts (or plugs) for transistor source, drain, or gate terminals. In another embodiment, the conductive features 106 are metal-x (Mx) level interconnects (e.g., metal wire features). For example, "x" may be 0, 1, 2, and so on. Although not shown, the conductive features 106 are coupled to active and/or passive components in the substrate 100 through underlying layers of the interconnect structure IS or through the terminals (e.g., source, drain, and gate contacts) of the active and/or passive components.

In some embodiments, the barrier layers 108 act as metal-diffusion barriers. As shown in FIG. 1A, the barrier layer 108 covers the side surfaces and the illustrated bottom surface of the corresponding conductive feature 106. In some embodiments, the material of the barrier layer 108 may include titanium (Ti), titanium nitride (TiN), tantalum (Ta), tantalum nitride (TaN), or other suitable materials. In some embodiments, the barrier layer 108 may be formed by suitable fabrication techniques such as CVD, atomic layer deposition (ALD) or PVD. As shown in FIG. 1A, the barrier layer 108 is illustrated as a single layer, but the disclosure is not limited thereto. In some alternative embodiments, the barrier layer 108 may be a multilayer structure.

After the conductive layer structure 104 is formed in the dielectric layer 102, an etch stop layer 110 is formed over the dielectric layer 102 and the conductive layer structure 104. The method of forming the etch stop layer 110 will be described in details below with reference to FIG. 1B to FIG. 1D and FIG. 2B to FIG. 2C.

Referring to both of FIG. 1B and FIG. 2B, multiple nitride-containing regions 112A are formed over the conductive features 106. In some embodiments, the forming process of the nitride-containing regions 112A may include the following steps: performing a surface treatment process S1 on the illustrated top surfaces of the conductive features 106; and then forming the nitride-containing regions 112A on the treated top surfaces of the conductive features 106. That is to say, before the nitride-containing regions 112A are formed on the top surfaces of the conductive features 106, the surface treatment process S1 is performed on the top surfaces of the conductive features 106 in advance. In some embodiments, the surface treatment process S1 is used for activating and/or cleaning the illustrated top surfaces of the conductive features 106 and fixing the defect vacancies within the conductive features 106. In detail, the surface treatment process S1 for the conductive features 106 contributes to render the treated top surfaces of the conductive features 106 having low activation energy and high reactivity with the subsequently formed nitride-containing regions 112A. That is to say, after performing the surface treatment process S1, compared with the illustrated top surface of the dielectric layer 102, the illustrated top surfaces of the conductive features 106 are highly prone to bond with the subsequently formed nitride-containing regions 112A. In some embodiments, the surface treatment process S1 may include a heat treatment process or a plasma treatment process. In certain embodiments, the surface treatment process S1 may include using a nitrogen-containing gas and a hydrogen-containing gas with a radio frequency (RF). For example, in an embodiment, the surface treatment process S1 includes using nitrogen ($N_2$) and ammonia ($NH_3$) with a high RF larger than about 10 watts. In some embodiments, the process temperature of the surface treatment process S1 may ranges from about 200° C. to about 400° C., such as from about 300° C. to about 400° C.

In some embodiments, the nitride-containing region 112A includes a nitride of a metal material. In this case, the nitride-containing region 112A is also referred to as a metal nitride region. In some embodiments, the metal material of the nitride-containing region 112A may include aluminum (Al), Ta, Ti, hafnium (Hf), zirconium (Zr), yttrium (Y), Co, or tungsten (W). For example, in an embodiment, the material of the nitride-containing region 112A includes aluminum nitride ($AlN_x$, where x>0). In some alternative embodiments, the material of the nitride-containing region 112A includes boron nitride. Further, in some embodiments, the nitride-containing region 112A may include additional impurity, such as H, Si, C, etc. In some embodiments, the nitride-containing region 112A is electrically insulating. In some embodiments, after the surface treatment process S1 is performed on the illustrated top surfaces of the conductive features 106, the nitride-containing regions 112A may be directly formed by suitable deposition techniques such as ALD, plasma enhanced atomic layer deposition (PEALD), CVD or PECVD using appropriate sources. For example, in an embodiment that the material of the nitride-containing region 112A includes $AlN_x$, ALD used includes repeating deposition cycles, and each cycle includes using a nitrogen source (e.g., $NH_3$ or $N_2$) and an Al source (e.g., trimethylaluminum (TMA) or tris(dimethylamido)aluminum (TDMAA)). In some alternative embodiments, after the surface treatment process S1 is performed on the illustrated top surfaces of the conductive features 106, the nitride-containing regions 112A may be formed by the following steps: forming a metal layer on the conductive features 106; and then performing a plasma treatment using a nitrogen-containing gas over the metal layer to convert the metal layer into the nitride-containing regions 112A. In some embodiments, the metal layer is formed by, for example, metal-organic CVD (MOCVD) or ALD with using appropriate metal source. For example, in an embodiment that the material of the nitride-containing region 112A includes $AlN_x$, an aluminum layer is formed by ALD using an Al source (e.g., trimethylaluminum (TMA) or tris(dimethylamido)aluminum (TDMAA), and then a plasma treatment using $NH_3$ and/or $N_2$ is performed over the aluminum layer to convert the aluminum layer into $AlN_x$.

As mentioned above, the top surfaces of the conductive features 106 treated by the surface treatment process S1 are highly prone to bond with the subsequently formed nitride-containing regions 112A, compared with the top surface of the dielectric layer 102, thereby during the deposition process for forming the nitride-containing regions 112A, the nitride-containing regions 112A are selectively formed on the treated top surfaces of the conductive features 106 without forming on the top surface of the dielectric layer 102. That is to say, the nitride-containing regions 112A cover the conductive features 106 without covering the dielectric layer 102. Furthermore, as shown in FIG. 1B, the nitride-containing regions 112A are in direct contact with the conductive features 106. As the conductive features 106 are separated from each other, the nitride-containing regions 112A formed corresponding to the conductive features 106 are separated from each other, as shown in FIG. 2B. Although the nitride-containing region 112A is formed to have a round top-view shape as shown in FIG. 2A, the disclosure is not limited thereto. In some alternative embodiments, the nitride-containing region 112A may exhibit a polygonal shape or other suitable shapes from the top view. In some embodiments, in a direction Z parallel to a normal direction of the substrate 100, the thickness t1 of the nitride-containing regions 112A ranges from about 3 Å to about 100 Å.

In some embodiments that the conductive layer structure 104 includes the conductive features 106 and the barrier layers 108, since the barrier layers 108 include metal materials and/or metal nitride materials, during the surface treatment process S1, the illustrated top surfaces of the barrier layers 108 may also be activated and/or cleaned and the defect vacancies and/or nitrogen vacancies within the barrier layers 108 may also be fixed. Accordingly, during the surface treatment process S1, the treated top surfaces of the barrier layers 108 are rendered to have low activation energy and high reactivity with the subsequently formed nitride-containing regions 112A. In such case, during the deposition process for forming the nitride-containing regions 112A, the treated top surfaces of the barrier layers 108 may bond with the nitride-containing regions 112A. That is to say, the nitride-containing regions 112A may directly cover the conductive features 106 and the barrier layers 108 without covering the dielectric layer 102, as shown in FIG. 1B and FIG. 2B.

Referring to both of FIG. 1C and FIG. 2C, after the nitride-containing regions 112A covering the conductive features 106 are formed, an oxide-containing region 112B is formed over the dielectric layer 102. In some embodiments, the forming process of the oxide-containing region 112B may include the following steps: performing a surface treatment process S2 on the illustrated top surface of the dielectric layer 102; and then forming the oxide-containing region 112B on the treated top surface of the dielectric layer 102. That is to say, before the oxide-containing region 112B is formed on the top surface of the dielectric layer 102, the surface treatment process S2 is performed on the top surface of the dielectric layer 102 in advance. In some embodiments, the surface treatment process S2 is used for activating and/or cleaning the illustrated top surface of the dielectric layer 102 and fixing the defect vacancies and/or oxygen vacancies within the dielectric layer 102. In detail, the surface treatment process S2 for the dielectric layer 102 contributes to render the treated top surface of the dielectric layer 102 having low activation energy and high reactivity with the subsequently formed oxide-containing region 112B. That is to say, after performing the surface treatment process S2, compared with the illustrated top surfaces of the nitride-containing regions 112A, the illustrated top surface of the dielectric layer 102 is highly prone to bond with the subsequently formed oxide-containing region 112B. In some embodiments, the surface treatment process S2 may include a heat treatment process or a plasma treatment process. In certain embodiments, the surface treatment process S2 may include using a nitrogen-containing gas and a hydrogen-containing gas with a radio frequency (RF). For example, in an embodiment, the surface treatment process S2 includes using nitrogen ($N_2$) and ammonia ($NH_3$) with a high RF larger than about 10 watts. In some embodiments, the process temperature of the surface treatment process S2 may ranges from about 200° C. to about 400° C., such as from about 300° C. to about 400° C.

In some embodiments, the oxide-containing region 112B includes an oxide of a metal material. Accordingly, the oxide-containing region 112B is also referred to as a metal oxide region through the description of the disclosure. In some embodiments, the oxide-containing region 112B is electrically insulating. In some embodiments, the metal material of the oxide-containing region 112B may include Al, Ta, Ti, Hf, Zr, Y, Co, or W. For example, in an embodiment, the material of the oxide-containing region 112B includes aluminum oxide ($AlO_x$, where x>0). Further, in some embodiments, the oxide-containing region 112B may include additional impurity, such as H, S1, C, etc. In some embodiments, after the surface treatment process S2 is performed on the illustrated top surface of the dielectric layer 102, the oxide-containing region 112B may be directly formed by suitable deposition techniques such as ALD, PEALD, CVD or PECVD using appropriate sources. For example, in an embodiment that the material of the oxide-containing region 112B includes $AlO_x$, ALD used includes repeating deposition cycles, and each cycle includes using an oxygen source (e.g., $O_2$, ozone ($O_3$), $H_2O$, an alkyl alcohol compound having the total carbon atom of from 1 to 10, or an aromatic alcohol compound having the total carbon atom of from 1 to 20) and an Al source (e.g., TMA or TDMAA). In some alternative embodiments, after the surface treatment process S2 is performed on the illustrated top surface of the dielectric layer 102, the oxide-containing region 112B may be formed by the following steps: forming a metal layer on the dielectric layer 102; and then performing a plasma treatment using an oxygen-containing gas over the metal layer to convert the metal layer into the oxide-containing region 112B. In some embodiments, the metal layer is formed by, for example, MOCVD or ALD with using appropriate metal source. For example, in an embodiment that the material of the oxide-containing region 112B includes $AlO_x$, an aluminum layer is formed by ALD using an Al source (e.g., TMA or TDMAA, and then a plasma treatment using $O_2$, $O_3$, $H_2O$, alkyl alcohol compound having the total carbon atom of from 1 to 10, and/or aromatic alcohol compound having the total carbon atom of from 1 to 20 is performed over the aluminum layer to convert the aluminum layer into $AlO_x$.

In some embodiments, the oxide-containing region 112B and the nitride-containing regions 112A may be deposited in the same process chamber. In some alternative embodiments, the oxide-containing region 112B and the nitride-containing regions 112A may be deposited in different process chambers. Further, as shown in FIG. 1B and FIG. 1C, the oxide-containing region 112B is formed after the nitride-containing regions 112A are formed. However, the disclosure is not limited thereto. In some alternative embodiments, the oxide-containing region 112B may be formed before the nitride-containing regions 112A are formed.

As mentioned above, the top surface of the dielectric layer 102 treated by the surface treatment process S2 is highly prone to bond with the subsequently formed oxide-containing region 112B, compared with the top surfaces of the nitride-containing regions 112A, thereby during the deposition process for forming the oxide-containing region 112B, the oxide-containing region 112B is selectively formed on the treated top surface of the dielectric layer 102 without forming on the top surfaces of the nitride-containing regions 112A. That is to say, the oxide-containing region 112B is formed to cover the dielectric layer 102. In other words, the oxide-containing region 112B is formed to directly contact the dielectric layer 102, as shown in FIG. 1C. From another point of view, as shown in FIG. 2C, the oxide-containing region 112B surrounds the nitride-containing regions 112A. In other words, the nitride-containing regions 112A are separated from each other by the oxide-containing region 112B. In some embodiments, in the direction Z, the thickness t2 of the oxide-containing region 112B ranges from about 3 Å to about 100 Å. In some embodiments, the thickness t2 of the oxide-containing region 112B is substantially equal to the thickness t1 of the nitride-containing region 112A. In some alternative embodiments, the thickness t2 of the oxide-containing region 112B is different from the thickness t1 of the nitride-containing region 112A.

As mentioned above, the nitride-containing regions 112A may include a nitride of a metal material and the oxide-containing region 112B may include an oxide of a metal material, thereby the nitride-containing regions 112A and the oxide-containing region 112B may be collectively referred to as a metal-containing layer 112. It is noted that the nitride-containing regions 112A may not include a nitride of a metal material in some embodiments, and thus in such case, only a portion of the metal-containing layer 112 contains metal material. As shown in FIG. 1C, the metal-containing layer 112 are formed over the dielectric layer 102, the conductive features 106 and the barrier layers 108. In addition, as shown in FIG. 1C, the illustrated top surface of the metal-containing layer 112 is planar (i.e., the illustrated top surface of the nitride-containing region 112A is substantially flush or coplanar with the illustrated top surface of the oxide-containing region 112B). However, the disclosure is not limited thereto. In some alternative embodiments, the illustrated top surface of the metal-containing layer 112 may be not planar. For example, in an embodiment, the illustrated top surface of the nitride-containing region 112A may not substantially flush or coplanar with the illustrated top surface of the oxide-containing region 112B. From another point of view, as the nitride-containing region 112A and the oxide-containing region 112B included in the metal-containing layer 112 are electrically insulating, the metal-containing layer 112 is also referred to as a metal-containing insulating layer through the description of the disclosure.

Figure 1D:
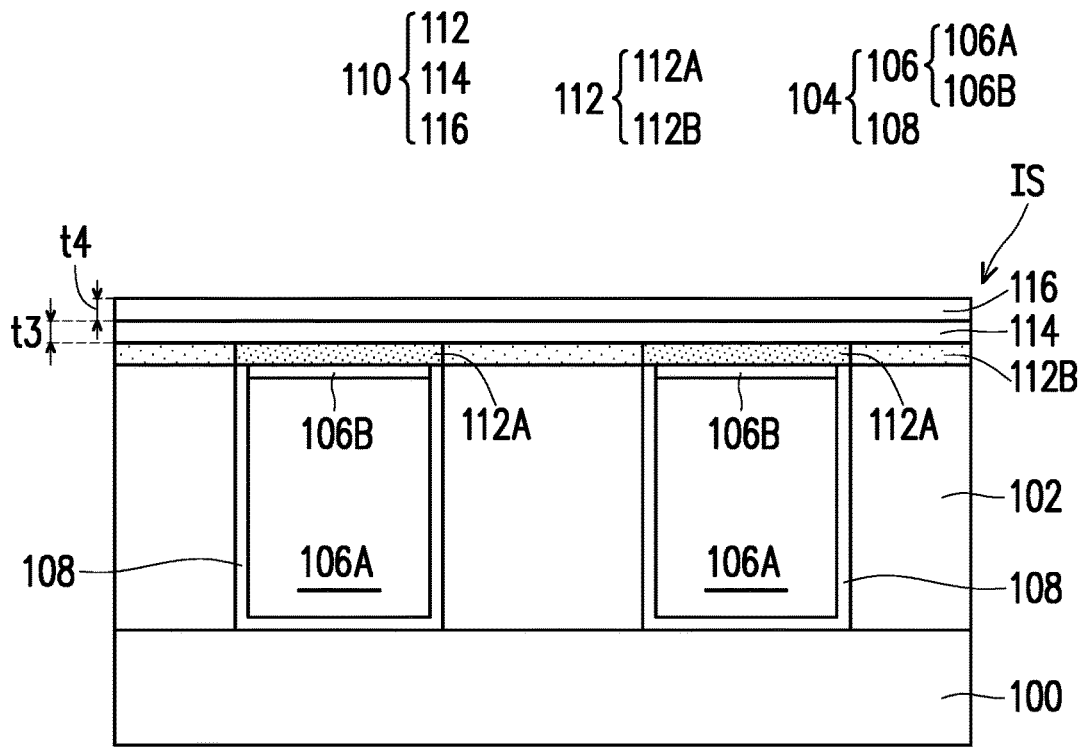
Figure 2A:
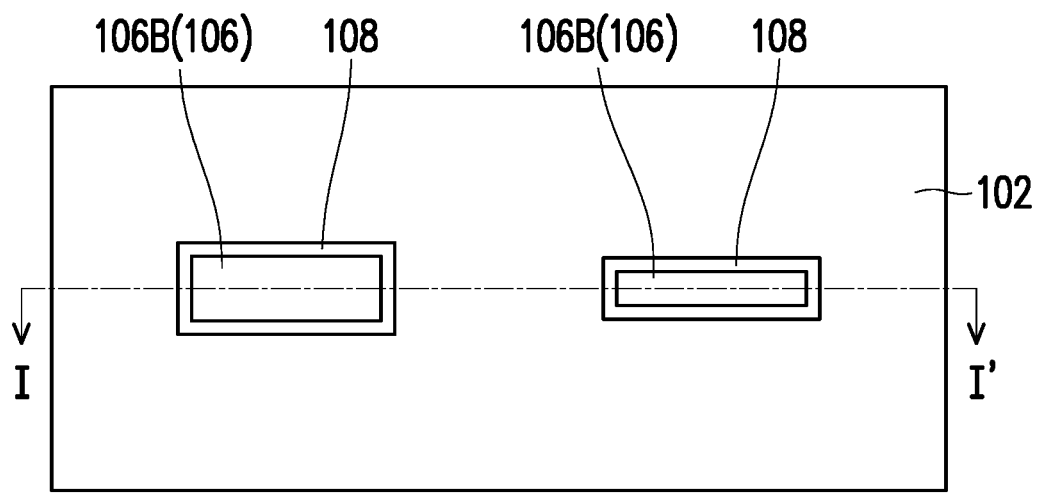
FIG. 2A is a schematic top view of the semiconductor structure in the stage of FIG. 1A in accordance with some embodiments of the disclosure.
Figure 2B:
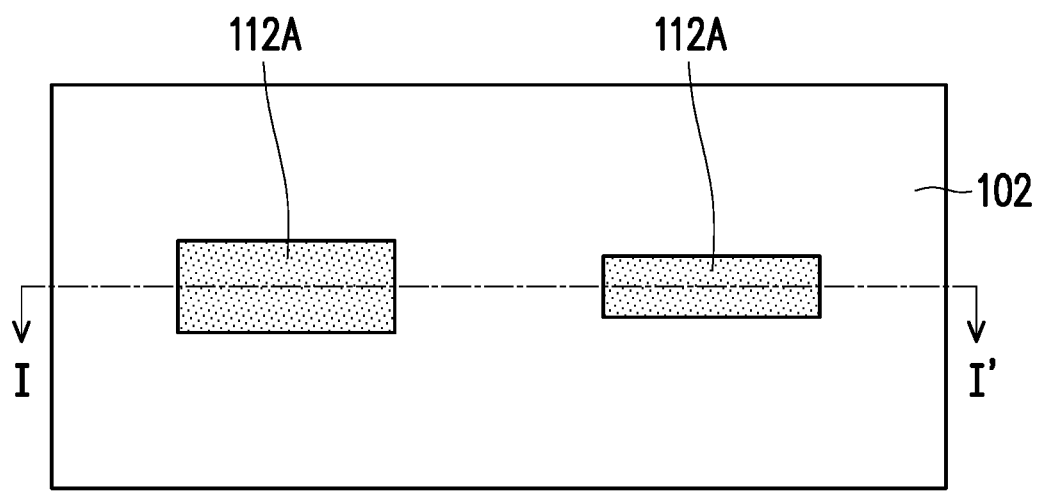
FIG. 2B is a schematic top view of the semiconductor structure in the stage of FIG. 1B in accordance with some embodiments of the disclosure.
Figure 2C:
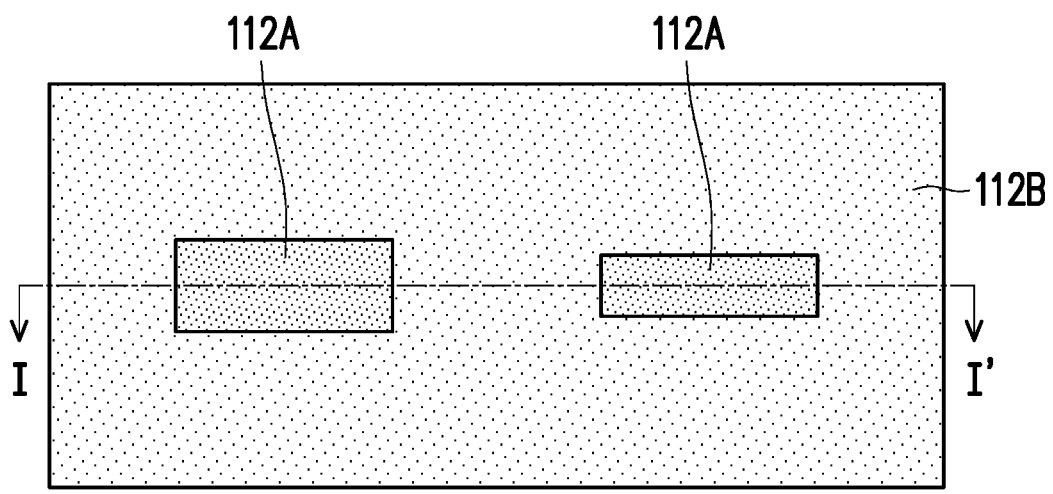
FIG. 2C is a schematic top view of the semiconductor structure in the stage of FIG. 1C in accordance with some embodiments of the disclosure.

Referring to FIG. 1D, a silicon-containing layer 114 is formed over the metal-containing layer 112. That is to say, the metal-containing layer 112 is located between the dielectric layer 102 and the silicon-containing layer 114. Also, the metal-containing layer 112 is located between the conductive features 106 and the silicon-containing layer 114. In some embodiments, the silicon-containing layer 114 may be formed as a conformal layer or a non-conformal layer. In some embodiments, the material of the silicon-containing layer 114 includes silicon and at least one of oxygen, carbon, and nitrogen. In some embodiments, the material of the silicon-containing layer 114 may include silicon carbide oxide (SiCO), silicon carbon nitride (SiCN), silicon carbide (SiC), silicon nitride (SiN), silicon oxide ($SiO_2$), silicon oxynitride (SiON) or silicon carbo-oxy-nitride (SiCON). In some embodiments, the silicon-containing layer 114 is electrically insulating. Accordingly, the silicon-containing layer 114 is also referred to as a silicon-containing insulating layer through the description of the disclosure. In some embodiments, the silicon-containing layer 114 may include additional impurity, such as H. In some embodiments, the silicon-containing layer 114 may be formed by suitable deposition techniques such as PVD, CVD, PECVD, ALD or PEALD. In some embodiments, the silicon-containing layer 114 is deposited in a chamber with a process temperature ranging from room temperature to about 600° C. and at a process pressure ranging from 0 to about 100 torr.

In some embodiments, the silicon-containing layer 114 functions as a barrier layer for preventing metal (e.g., copper) diffusion. Further, the silicon-containing layer 114 also may function as a hermetic layer between a layer over the silicon-containing layer 114 (e.g., the metal-containing layer 116 (described hereinafter)) and a layer underneath the silicon-containing layer 114 (e.g., the metal-containing layer 112). In some embodiments, the silicon-containing layer 114 is controlled to be thinner than about 1000 Å. In some embodiments, in the direction Z, the thickness t3 of the silicon-containing layer 114 ranges from about 3 Å to about 150 Å. The thickness t3 of the silicon-containing layer 114 may be controlled to achieve a balance in design needs. A thicker silicon-containing layer 114 may provide better metal-barrier and hermetic functions, at the expense of increased package size.

Continue referring to FIG. 1D, a metal-containing layer 116 is formed over the silicon-containing layer 114 to render an etch stop layer 110 over the dielectric layer 102 and the conductive features 106. That is to say, as shown in FIG. 1D, the etch stop layer 110 includes the metal-containing layer 112, the silicon-containing layer 114 and the metal-containing layer 116, wherein the silicon-containing layer 114 is located between the metal-containing layer 112 and the metal-containing layer 116. In other words, the etch stop layer 110 includes three sub-layers. However, the disclosure is not limited thereto. In some alternative embodiments, the etch stop layer 110 may include two sub-layers. For example, in an embodiment, the etch stop layer 110 may include the metal-containing layer 112 and the silicon-containing layer 114.

In some embodiments, the metal-containing layer 116 may be formed as a conformal layer or a non-conformal layer. In some embodiments, the material of the metal-containing layer 116 includes a metal and at least one of oxygen, carbon, and nitrogen. In some embodiments, the metal material of the metal-containing layer 116 may include Al, Ta, Ti, Hf, Zr, Y, Co, or W. In some embodiments, the material of the metal-containing layer 116 may include $AlO_x$, aluminum oxy-carbide (AlOC), aluminum oxynitride (ALON), hafnium oxide, zirconium oxide, tantalum oxide, titanium oxide, yttrium oxide, cobalt oxide or tungsten oxide. In some embodiments, the metal-containing layer 116 is electrically insulating. Accordingly, the metal-containing layer 116 is also referred to as a metal-containing insulating layer through the description of the disclosure. In some embodiments, the metal-containing layer 116 has large etching selectivity with respect to a low-k dielectric material, such as the material in the dielectric layer 102, and the material in the dielectric layer 120 (described hereinafter). For example, an etching selectivity of the metal-containing layer 116 with respect to the low-k dielectric material is about 3 or more in some embodiments, and is about 4 or more in other embodiments. In one embodiment, the etching selectivity of the metal-containing layer 116 with respect to the low-k dielectric material ranges from about 4 to about 6. As such, by including the metal-containing layer 116 in the etch stop layer 110, the new etch stop layer 110 can more effectively prevent openings 130 and openings 132 (described hereinafter) from under-etching and over-etching issues.

In some embodiments, the metal-containing layer 116 may be formed by suitable deposition techniques such as PVD, CVD, PECVD, MOCVD, ALD, PEALD or plating (e.g., electroplating or electro-less plating). In certain embodiments, the metal-containing layer 116 may be formed by the similar method as discussed above with respect to the nitride-containing region 112A and the oxide-containing region 112B. That is to say, the metal-containing layer 116 may be directly formed by suitable deposition techniques, or the metal-containing layer 116 may be formed by the following steps: forming a metal layer first; and then performing a plasma treatment over the metal layer. In some embodiments, the metal-containing layer 116 is formed in a chamber with a process temperature ranging from room temperature to about 600° C. and at a process pressure ranging from 0 to about 100 torr. In some embodiments, the metal-containing layer 116 and the silicon-containing layer 114 may be deposited in the same process chamber. In some alternative embodiments, the metal-containing layer 116 and the silicon-containing layer 114 may be deposited in different process chambers. In some embodiments, the metal-containing layer 116 is controlled to be thinner than about 500 Å. In some embodiments, in the direction Z, the thickness t4 of the metal-containing layer 116 ranges from about 3 Å to about 150 Å. The thickness t4 of the metal-containing layer 116 may be controlled to achieve a balance in design needs. A thicker metal-containing layer 116 may provide a stronger etch-stop function, at the expense of increased package size.

As mentioned above, the new etch stop layer 110 includes the metal-containing layer 112 which includes the nitride-containing regions 112A contacting the conductive features 106 and the oxide-containing region 112B contacting the dielectric layer 102. It is noted that owing to highly bonding strength between the nitride-containing regions (i.e., the metal nitride regions) 112A and the conductive features 106, by forming the nitride-containing regions 112A contacting the conductive features 106, the issue of the formation of pits in the conductive features 106 under the high pressure $H_2$ anneal (HPA) process can be prevented or greatly suppressed. Further, it is also noted that by forming the oxide-containing region 112B contacting the dielectric layer 102, the leakage current between the closely adjacent conductive features 106 can be reduced and the high time-dependent dielectric breakdown (TDDB) characteristic and the high breakdown voltage (VBD) characteristic can be accordingly achieved. As a result, by including the nitride-containing regions 112A and the oxide-containing region 112B (i.e., the metal-containing layer 112) in the etch stop layer 110, the performance, yield and reliability of the subsequently formed semiconductor structure 10 and the subsequently formed device including the semiconductor structure 10 can be improved. In some embodiments, the amount of the pits formed in the conductive features 106 under the HPA process can be significantly reduced by at least 95%. In some embodiment, the TDDB characteristic and the VBD characteristic of the subsequently formed semiconductor structure 10 and/or the subsequently formed device including the semiconductor structure 10 are improved by about 1.5 times to about 100 times.

Figure 1E:
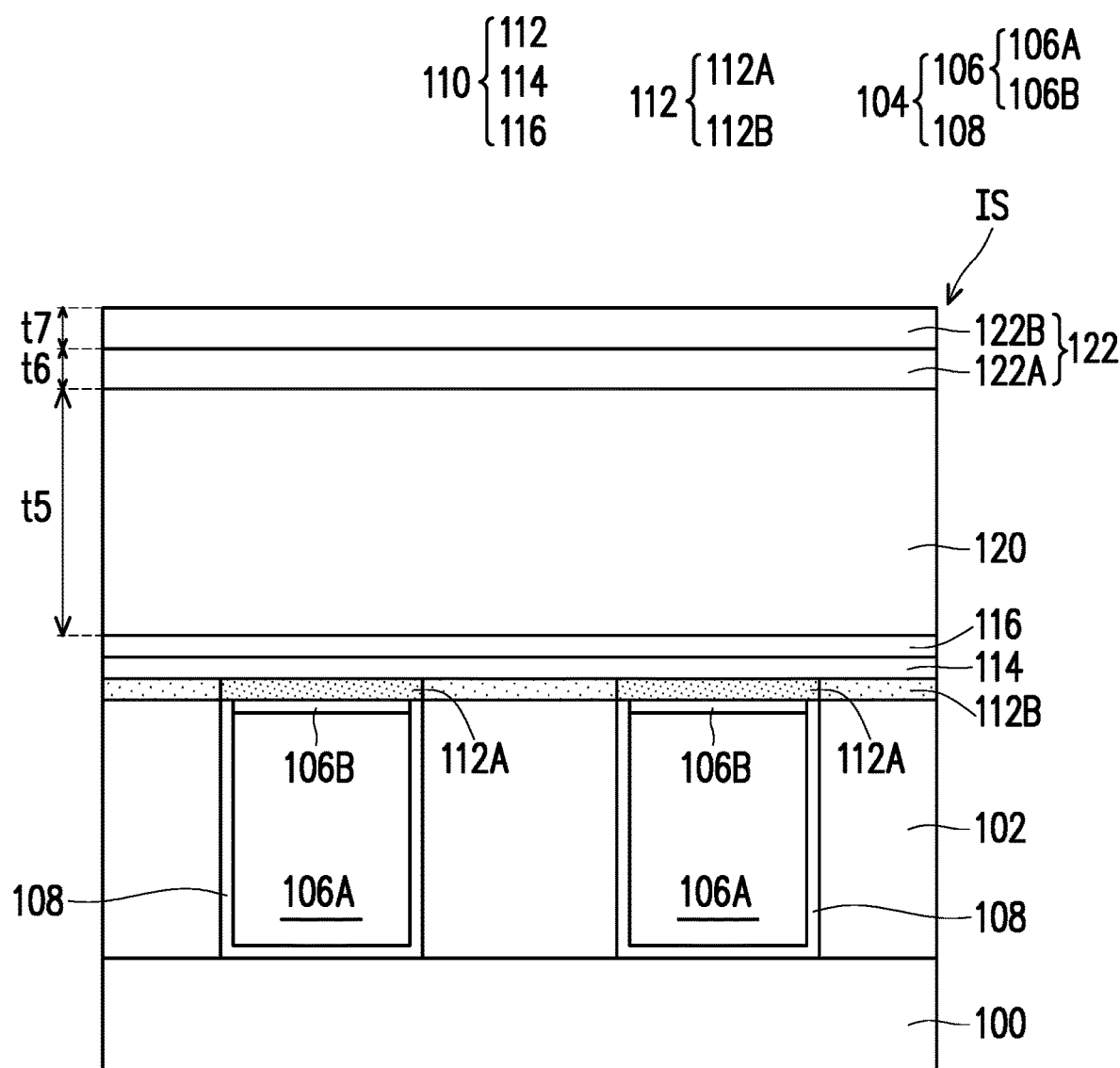

Referring to FIG. 1E, a dielectric layer 120 is formed over the etch-stop layer 110. In some embodiments, the dielectric layer 120 may be made of a low-k dielectric material. In some embodiments, the low-k dielectric material is generally a dielectric material having a dielectric constant (k-value) lower than about 4.5. For example, the dielectric layer 120 may be made of a low-k dielectric material having a k-value lower than about 2.3. Examples of the low-k dielectric material may include TEOS oxide, un-doped silicate glass, or doped silicon oxide such as BPSG, FSG, PSG, BSG. In some embodiments, the dielectric layer 120 may include the same material as the dielectric layer 102. In some alternative embodiments, the materials of the dielectric layer 120 and the dielectric layer 102 may be different. In some embodiments, the dielectric layer 120 may be formed by suitable fabrication techniques such as spin-on coating, CVD, LPCVD, PECVD, HDPCVD, FCVD, ALCVD or PVD. As shown in FIG. 1E, the dielectric layer 120 is illustrated as a bulky layer, but the disclosure is not limited thereto. In some alternative embodiments, the dielectric layer 120 may be constituted by multiple dielectric layers. In some embodiments, in the direction Z, the thickness t5 of the dielectric layer 120 ranges from about 10 nm to about 200 nm.

Continue referring to FIG. 1E, a mask layer 122 is formed on the dielectric layer 120. In detail, as shown in FIG. 1E, the mask layer 122 includes a first mask layer 122A disposed on the dielectric layer 120 and a second mask layer 122B disposed on the first mask layer 122A. In some embodiments, the first mask layer 122A is made of a dielectric material, such as silicon-based insulating material. Examples of the silicon-based insulating materials may include TEOS oxide, $SiO_2$, or other suitable materials. In some embodiments, in the direction Z, the thickness t6 of the first mask layer 122A ranges from about 10 nm to about 300 nm. In some embodiments, the second mask layer 122B is made of a metal-based material, such as TiN, TaN, or titanium oxide ($TiO_2$). In some embodiments, in the direction Z, the thickness t7 of the second mask layer 122B ranges from about 3 nm to about 100 nm.

Figure 1F:
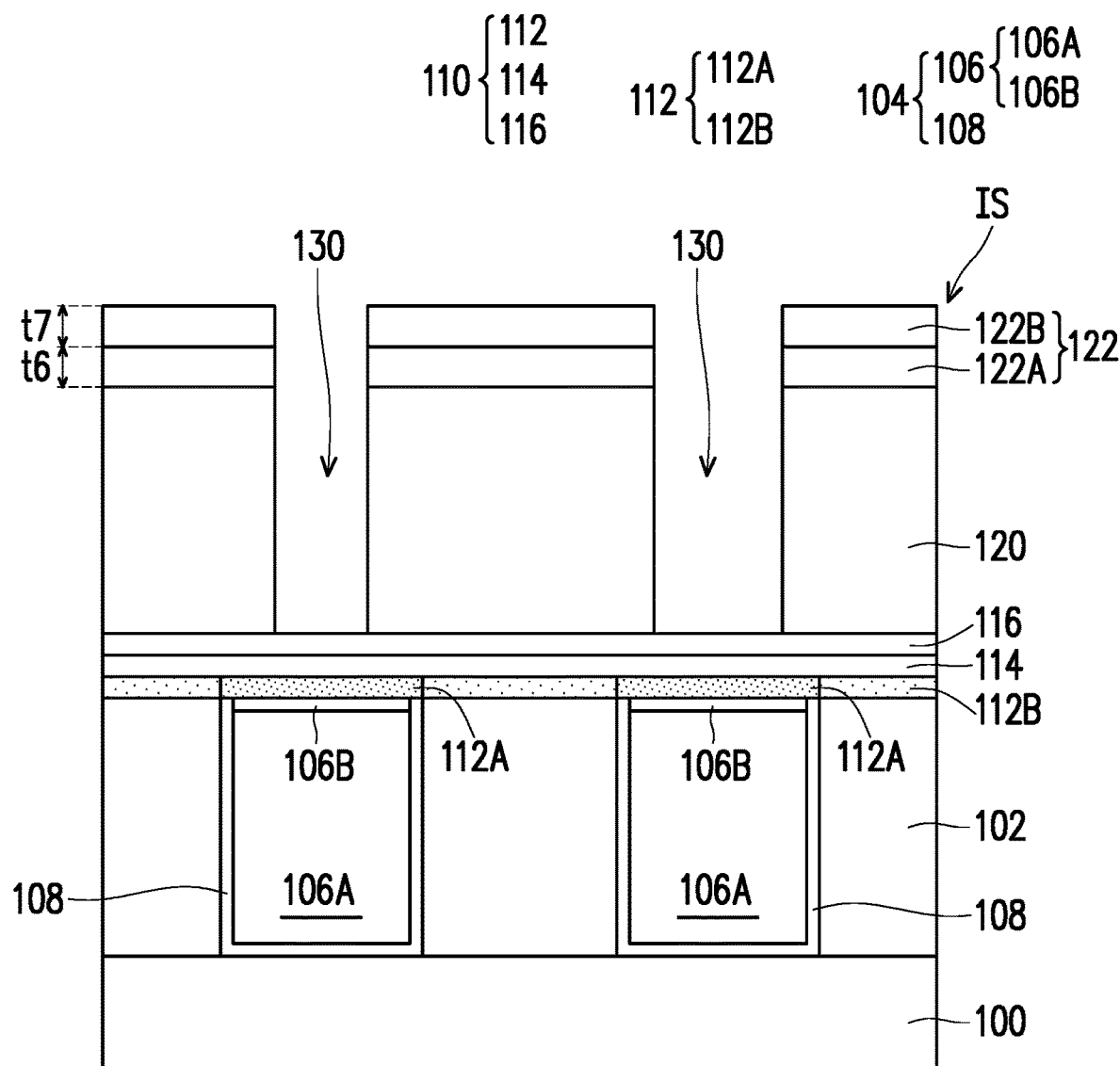

Referring to FIG. 1F, portions of the dielectric layer 120 are removed to form multiple openings 130 exposing portions of the etch stop layer 110. In detail, top surfaces of portions of the metal-containing layer 116 are exposed by the openings 130, as shown in FIG. 1F. In some embodiments, the method of forming the openings 130 in the dielectric layer 120 may include the following steps: forming a photo resist pattern having an opening (not shown) on the second mask layer 122B; patterning the second mask layer 122B by using the photo resist pattern as an etching mask; removing the photo resist pattern; patterning the first mask layer 122A by using the patterned second mask layer 122B as an etching mask; and then patterning the dielectric layer 120 by using the patterned first mask layer 122A and the patterned second mask layer 122B as an etching mask. In some alternative embodiments, the photo resist pattern remains on the patterned second mask layer 122B during the patterning of the first mask layer 122A, and the photo resist pattern is removed after the first mask layer 122A is patterned. In such case, the first mask layer 122A is patterned by using the patterned second mask layer 122B and the photo resist pattern as an etching mask. In some embodiments, the patterning of the dielectric layer 120 includes performing an etching process, such as a dry etching process.

As mentioned above, the etching selectivity of the metal-containing layer 116 in the etch stop layer 110 with respect to the dielectric layer 120 is high, thereby during the etching process of the dielectric layer 120, the etch stop layer 110 is not substantially etched even after the surface of the metal-containing layer 116 is exposed. In other words, the etch stop layer 110 functions as an etch stop layer for the etching process used for forming the openings 130 in the dielectric layer 120. For illustration purposes, FIG. 1F shows that the one of the openings 130 at the left side has a smaller critical dimension (CD) and a higher aspect ratio than the one of the openings 130 at the right side. Conventionally, in many cases, it is more likely that the etching process of the one of the openings 130 at the right side exposes the metal-containing layer 116 earlier than the etching process of the one of the openings 130 at the left side does, because more etchants reach into the one of the openings 130 at the right side and react with the dielectric material therein. In some embodiments, since the etch stop layer 110 includes the metal-containing layer 116 having high etching selectivity with respect to the dielectric layer 120, even the continuous etching process is performed to ensure all openings 130 reach the metal-containing layer 116, the metal-containing layer 116 can withstand the continuous etching process so as to effectively prevent the under-etching and over-etching issues. Accordingly, the performance and yield of the subsequently formed semiconductor structure 10 and the subsequently formed device including the semiconductor structure 10 can be improved.

Figure 1G:
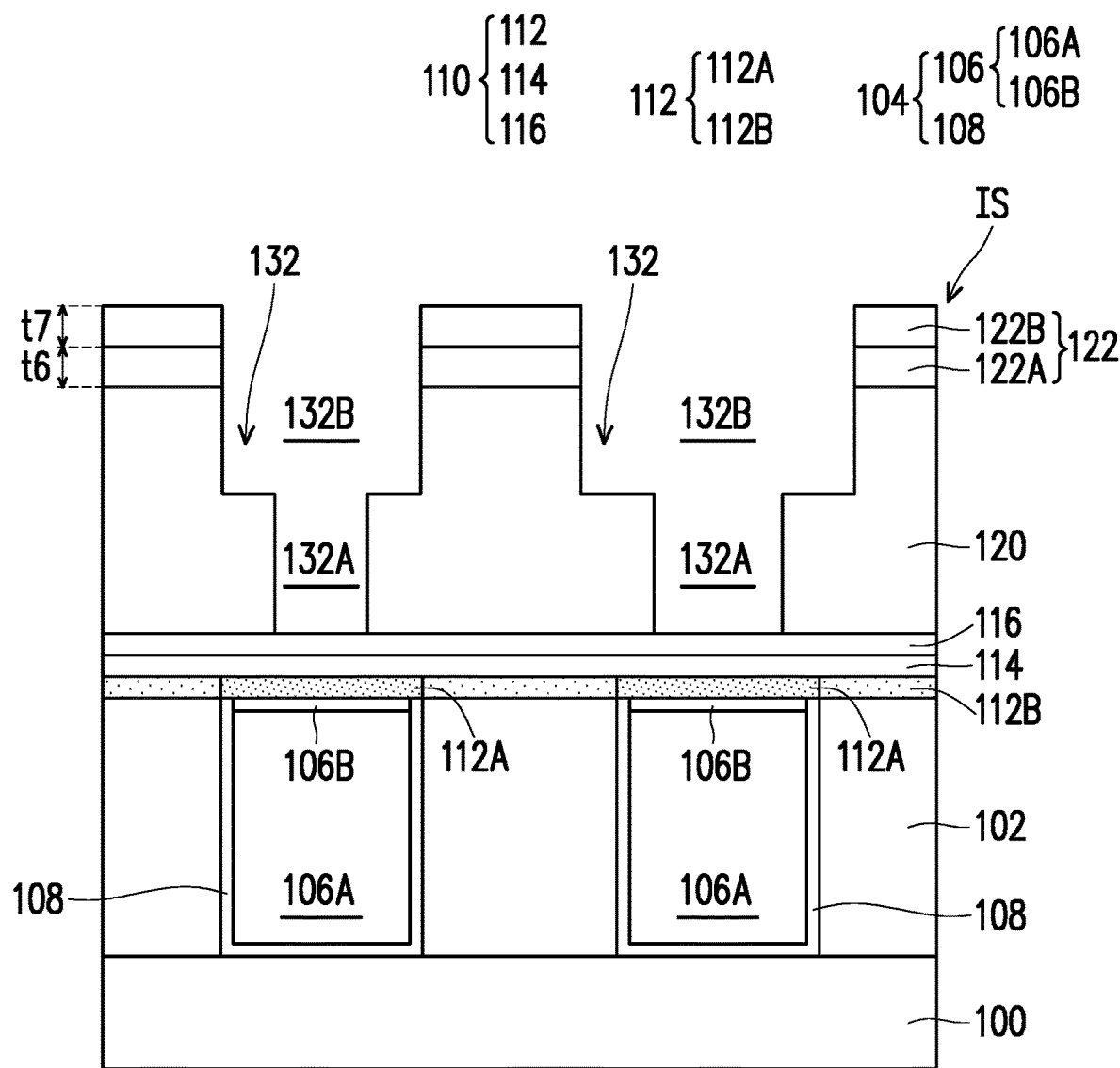

Referring to FIG. 1G, after the openings 130 are formed, other portions of the dielectric layer 120 are removed to form multiple openings 132 exposing portions of the etch stop layer 110. In detail, as shown in FIG. 1F, each of the openings 132 includes a top portion 132B and a bottom portion 132A. In some embodiments, the top portion 132B of the opening 132 is a placeholder for a wiring of the interconnect structure IS, and the bottom portion 132A of the opening 132 is a placeholder for a via (or a plug) of the interconnect structure IS. That is to say, the top portion 132B of the opening 132 corresponds to a wiring pattern of the interconnect structure IS, and the bottom portion 132A of the opening 132 corresponds to a via pattern (or a plug pattern)

of the interconnect structure IS. In some embodiments, the bottom portions 132A of the openings 132 are originated from the openings 130. That is to say, the openings 132 expose the same portions of the etch stop layer 110 as the openings 130. In other words, the openings 132 expose the same portions of the metal-containing layer 116 as the openings 130, as shown in FIG. 1F. In some embodiments, the method of forming the bottom portions 132A of the openings 132 is substantially similar to the method of forming the openings 130. That is to say, the method of forming the bottom portions 132A of the openings 132 may include performing a photolithography processes and multiple etching processes, as discussed above. Moreover, similar to the etching process of dielectric layer 120 for the openings 130 discussed above, the etch stop layer 110 also functions as an etch stop layer for the etching process used for forming the openings 132 in the dielectric layer 120. It is noted that the order of the patterning operation of FIG. 1F and the patterning operation of FIG. 1G may be interchangeable.

Figure 1H:
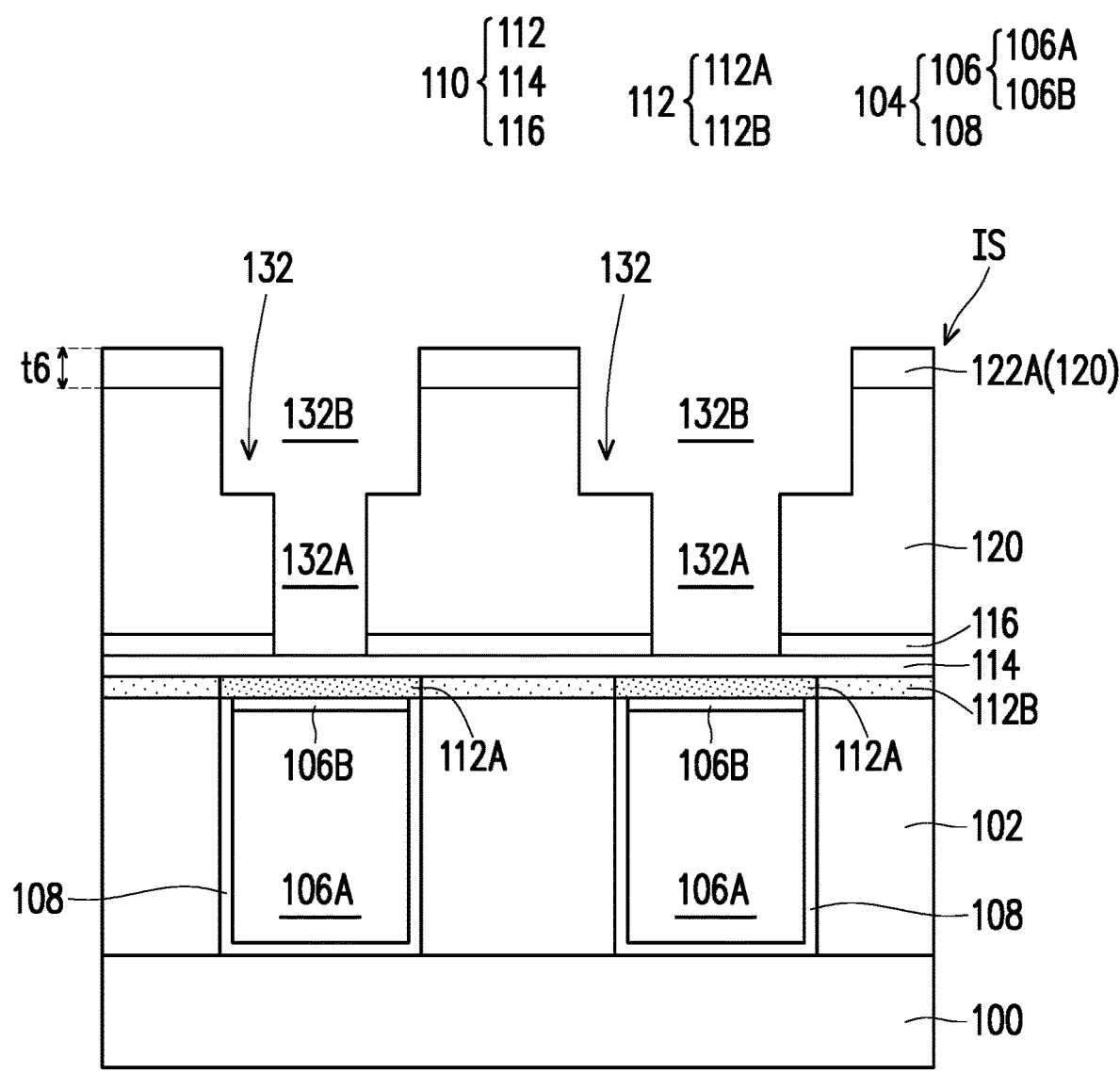

Referring to FIG. 1H, after the openings 132 are formed, the second mask layer 122B of the mask layer 122 is removed. In some embodiments, the second mask layer 122B is removed by an etching process, such as a wet etching process. In some embodiments, as shown in FIG. 1H, during the etching process of the second mask layer 122B, the portions of the metal-containing layer 116 exposed by the openings 132 are also removed. That is to say, after the etching process of the second mask layer 122B, top surfaces of portions of the silicon-containing layer 114 in the etch stop layer 110 are exposed by the openings 132.

Figure 1I:
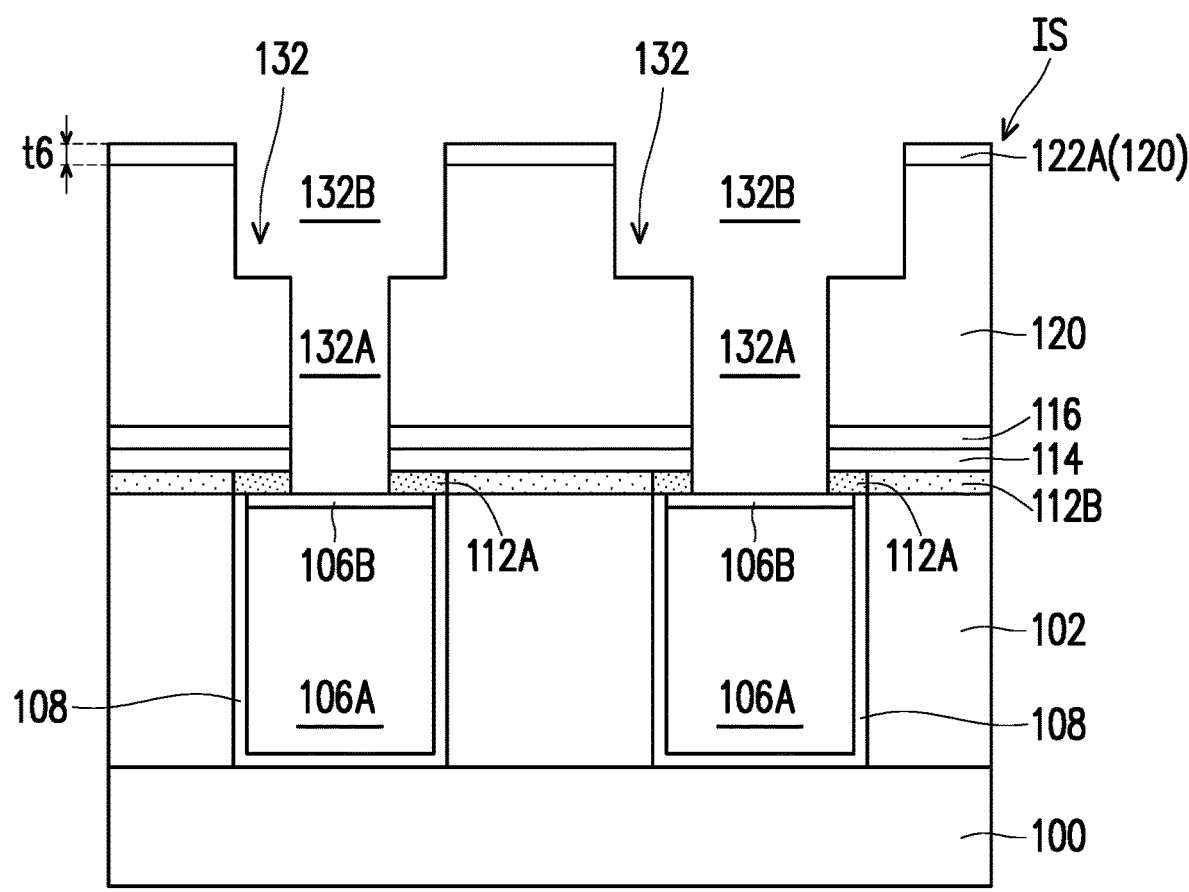

Referring to FIG. 1I, after the second mask layer 122B is removed, the etch stop layer 110 is removed to expose portions of the conductive features 106. In detail, portions of the silicon-containing layer 114 and the nitride-containing regions 112A of the metal-containing layer 112 exposed by the openings 132 are removed, as shown in FIG. 1I. In some embodiments, the silicon-containing layer 114 and the nitride-containing regions 112A are removed by an anisotropic etching process, such as a dry etching process, which is selectively tuned to remove the materials of the silicon-containing layer 114 and the nitride-containing regions 112A while the dielectric layer 120 remains substantially unchanged. In some embodiments, during the etching process of the silicon-containing layer 114 and the nitride-containing regions 112A, the first mask layer 122A may be slightly etched as well, and the thickness t6 of the first mask layer 122A may be reduced. In some embodiments, a cleaning process may be performed to remove residues from the exposed portions of the conductive features 106.

Figure 1J:
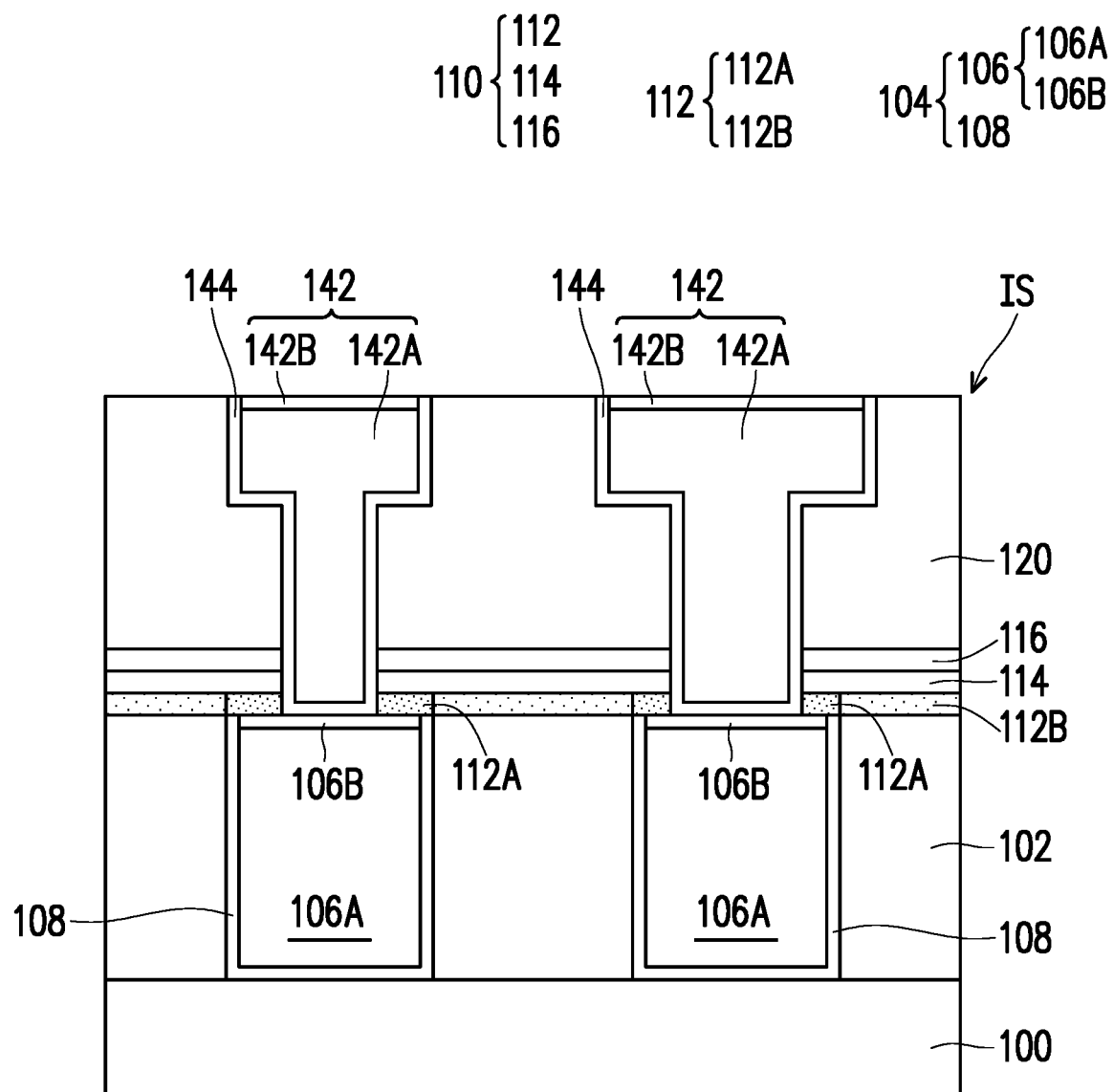

Referring to FIG. 1J, a conductive layer structure 140 is formed in the openings 132. In some embodiments, the conductive layer structure 140 may include multiple conductive features 142 and multiple barrier layers 144. As shown in FIG. 1J, the barrier layers 144 are formed as a liner layer on sidewalls and bottom surfaces of the openings 132, and the conductive features 142 are formed in the openings 132 over the barrier layers 144. In some embodiments, the conductive feature 142 may include a body layer 142A and a capping layer 142B over the body layer 142A. In some embodiments, the body layer 142A may be formed of Cu, Cu alloy or other suitable metals. In some embodiments, the capping layer 142B functions as a Cu diffusion barrier. In some embodiments, the capping layer 142B may be formed of Co, Ni, Ru, Mo, CoWP, NiMoP or other suitable materials. In some embodiments, the material of the barrier layer 144 may include Ti, TiN, Ta, TaN, or other suitable materials. In some embodiments, the conductive features 142 electrically connect with the conductive features 106. In some embodiments that the conductive layer structure 140 includes the conductive features 142 and the barrier layers 144, the electrical connection between the conductive features 142 and the conductive features 106 is rendered through the barrier layers 144. However, the disclosure is not limited thereto. In some alternative embodiments, the conductive layer structure 140 includes the conductive features 142, but does not include barrier layers. In such case, the conductive features 142 are in direct contact with the conductive features 106 to render electrical connection between them.

As mentioned above, the openings 132 correspond to the wiring patterns and the via patterns (or the plug patterns) of the interconnect structure IS, therefore the conductive features 142 are part of the interconnect structure IS of the semiconductor structure 10. In view of this, the dielectric layer 120 in which the conductive features 142 are formed may be referred to as an interlayer dielectric layer. In an embodiment, the conductive features 142 are metal-x (Mx) level interconnects (e.g., metal wire features). For example, "x" may be 0, 1, 2, and so on.

In some embodiments, the body layer 142A may be formed by suitable fabrication techniques such as sputtering, CVD or plating (e.g., electroplating or electro-less plating), and the capping layer 142B may be formed by suitable fabrication techniques such as sputtering, CVD or plating (e.g., electroplating or electro-less plating). Referring to the description of FIG. 1F to FIG. 1I mentioned above, those skilled in the art should understand that the conductive features 142 is made by a dual-damascene process. However, the disclosure is not limited thereto. In some alternative embodiments, the conductive features 142 may be made by multiple single damascene processes. In some embodiments, the barrier layer 144 may be formed by suitable fabrication techniques such as CVD, ALD or PVD. As shown in FIG. 1J, the barrier layer 144 is illustrated as a single layer, but the disclosure is not limited thereto. In some alternative embodiments, the barrier layer 144 may be a multilayer structure. In some embodiments, a planarization process may be performed to remove the conductive features 142 and the barrier layers 144 outside the openings 132, such that the illustrated top surfaces of the conductive features 142, the illustrated top surfaces of the barrier layers 144 and the illustrated top surface of the dielectric layer 120 are substantially flush or coplanar with each other. In some embodiments, the planarization process may include a chemical mechanical polishing (CMP) process or a mechanical grinding process. Moreover, during the planarization process, the first mask layer 122A is also removed.

As shown in FIG. 1J, the illustrated top surface of the body layer 142A and the illustrated top surface of the capping layer 142B are planar surfaces, and the illustrated top surface of the capping layer 142B is substantially coplanar with the illustrated top surface of the dielectric layer 120 and the illustrated top surface of the barrier layer 144. However, the disclosure is not limited thereto. In some alternative embodiments, the illustrated top surface of the body layer 142A and the illustrated top surface of the capping layer 142B may be curved surfaces (e.g. convex surfaces) from the illustrated top surface of the dielectric layer 120. That is, the illustrated top surface of the body layer 142A and the illustrated top surface of the capping layer 142B are not planar, and a portion of the capping layer 142B protrudes from and is higher than the illustrated top surface of the dielectric layer 120 and the illustrated top surface of the barrier layer 144.

Still referring to FIG. 1J, in this manufacture stage, the semiconductor structure 10 including the substrate 100, the dielectric layer 102 over the substrate 100, the conductive features 106 in the dielectric layer 102, the new and improved etch stop layer 110 that includes the metal-containing layer 112 having the nitride-containing regions 112A contacting the conductive features 106 and the oxide-containing region 112B contacting the dielectric layer 102, the dielectric layer 120 over the etch stop layer 110, and the conductive features 142 penetrating the dielectric layer 120 and electrically connecting with the conductive features 106 is formed. Further, after the conductive layer structure 140 is formed, the steps of FIG. 1B to FIG. 1J may be repeated to form one or more conductive layer structures of the interconnect structure in the semiconductor structure 10.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the method of manufacturing the semiconductor structure 10 with reference to FIGS. 1A-1J, during the formation of the metal-containing layer 112, the surface treatment process S1 is performed followed by forming the nitride-containing regions 112A covering the conductive features 106, and the surface treatment process S2 is performed followed by forming the oxide-containing region 112B covering the dielectric layer 102. However, the disclosure is not limited thereto. In some alternative embodiments, during the formation of the metal-containing layer 112, one of the surface treatment process S1 and the surface treatment process S2 is not performed. For example, in an embodiment, the oxide-containing region 112B covering the dielectric layer 102 is formed without performing the surface treatment process S2 in advance. Hereinafter, other embodiments will be described with reference to FIGS. 3A-3B and FIGS. 4A-4D.

Figure 3A:
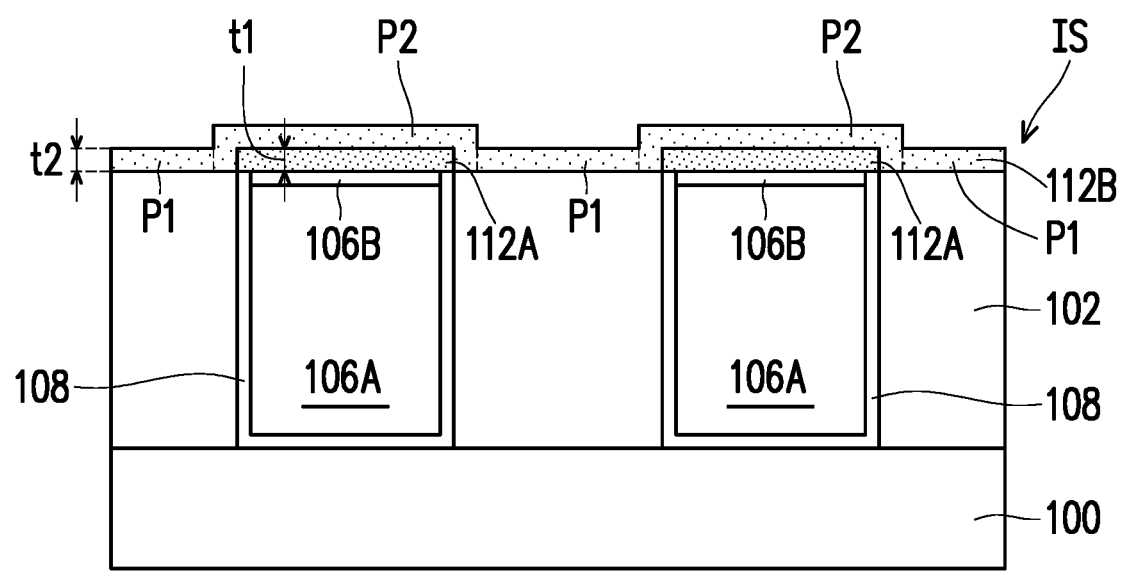
FIG. 3A to FIG. 3B are schematic cross-sectional views of various stages in a manufacturing method of a semiconductor structure in accordance with some alternative embodiments of the present disclosure.
Figure 3B:
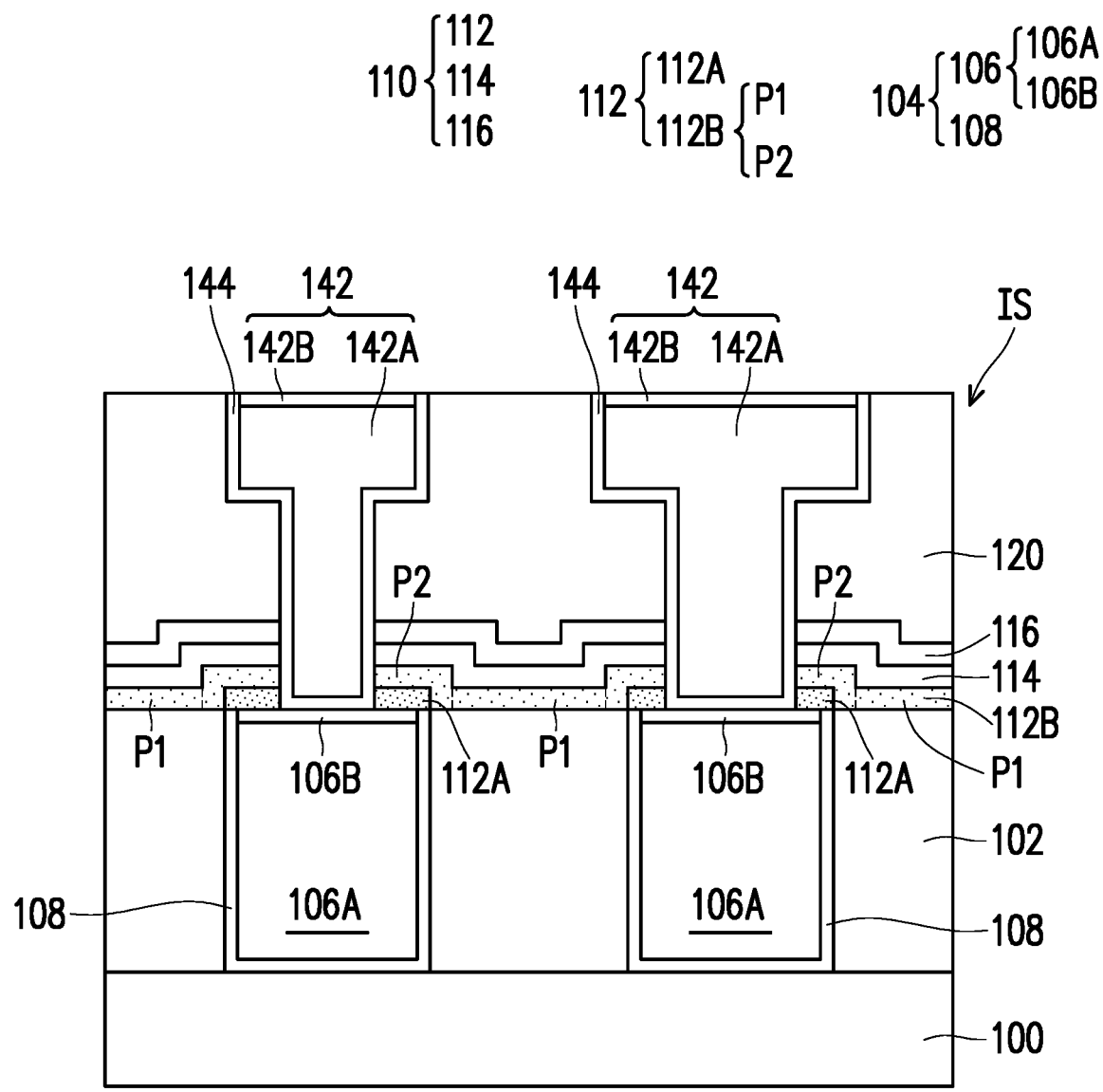

FIG. 3A to FIG. 3B are schematic cross-sectional views of various stages in a manufacturing method of a semiconductor structure 20 in accordance with some alternative embodiments of the present disclosure. The elements similar to or substantially the same as the elements described previously will use the same reference numbers, and certain details or descriptions (e.g. the materials, formation processes, positioning configurations, etc.) of the same or similar elements would not be repeated herein, and differences between the embodiments with reference to FIGS. 3A-3B and the embodiments described previously will be described below.

Referring to FIG. 3A, a structure same as the structure of FIG. 1B is provided. Details or descriptions (e.g. the materials, formation processes, positioning configurations, etc.) of the substrate 100, the dielectric layer 102, the conductive layer structure 104 and the nitride-containing regions 112A have been described in conjunction with FIGS. 1A-1B and FIGS. 2A-2B above, and will not be iterated herein again. Accordingly, for details or descriptions of the substrate 100, the dielectric layer 102, the conductive layer structure 104 and the nitride-containing regions 112A not iterated herein, please refer to the aforesaid embodiments.

Continued on FIG. 3A, an oxide-containing region 112B is formed over the dielectric layer 102 and the nitride-containing regions 112A to render a metal-containing layer 112. In detail, the oxide-containing region 112B of the metal-containing layer 112 includes a first portion P1 and a second portion P2 connecting with the first portion P1, the first portion P1 is located on and contacts the dielectric layer 102, and the second portion P2 covers the nitride-containing regions 112A. That is to say, the oxide-containing region 112B in the semiconductor structure 20 is globally formed over the substrate 100, but not selectively formed over the substrate 100. In other words, the oxide-containing regions 112B is formed without performing the surface treatment process S2, which is beneficial to significantly enhance the reactivity between the oxide-containing region 112B and the top surface of the dielectric layer 102, in advance. From another point of view, in the direction Z, the thickness of the metal-containing layer 112 that is located on and contacts the conductive features 106 is greater than the thickness of the metal-containing layer 112 that is located on and contacts the dielectric layer 102. For example, the thickness of the metal-containing layer 112 that is located on and contacts the conductive features 106 is the sum of the thickness t1 of the nitride-containing region 112A and the thickness t2 of the oxide-containing region 112B, and the thickness of the metal-containing layer 112 that is located on and contacts the dielectric layer 102 is the thickness t2 of the oxide-containing region 112B. In some embodiments, the oxide-containing region 112B in the semiconductor structure 20 may be formed as a conformal layer or a non-conformal layer. Details or descriptions (e.g. the materials, formation processes, etc.) of the oxide-containing region 112B and the metal-containing layer 112 have been described in conjunction with FIG. 1C and FIG. 2C above, and will not be iterated herein again. Accordingly, for details or descriptions of the oxide-containing region 112B and the metal-containing layer 112 not iterated herein, please refer to the aforesaid embodiments.

Referring to FIG. 3B, the semiconductor structure 20 including the substrate 100, the dielectric layer 102 over the substrate 100, the conductive features 106 in the dielectric layer 102, a new and improved etch stop layer 110 that includes the metal-containing layer 112 having the nitride-containing regions 112A contacting the conductive features 106 and the oxide-containing region 112B contacting the dielectric layer 102 and the nitride-containing regions 112A, a dielectric layer 120 over the etch stop layer 110, and a conductive layer structure 140 penetrating the dielectric layer 120 and the etch stop layer 110 and electrically connecting with the conductive features 106 is formed. Details or descriptions (e.g. the materials, formation processes, positioning configurations, etc.) of the etch stop layer 110, the dielectric layer 120 and the conductive layer structure 140 have been described in conjunction with FIGS. 1D-1J above, and will not be iterated herein again. Accordingly, for details or descriptions of the etch stop layer 110, the dielectric layer 120 and the conductive layer structure 140 not iterated herein, please refer to the aforesaid embodiments. Further, referring to FIG. 3B and FIG. 1J, the semiconductor structure 20 illustrated in FIG. 3B is similar to the semiconductor structure 10 illustrated in FIG. 1J, and the differences between them lie in that: in the semiconductor structure 20, the oxide-containing region 112B covers the illustrated top surface of the dielectric layer 102 and the illustrated top surfaces of the nitride-containing regions 112A, and the conductive layer structure 140 penetrates both the nitride-containing regions 112A and the oxide-containing region 112B of the metal-containing layer 112; while in the semiconductor structure 10, the oxide-containing region 112B covers the illustrated top surface of the dielectric layer 102 and surrounds the nitride-containing regions 112A without covering the illustrated top surfaces of the nitride-containing regions 112A, and the conductive layer structure 140 penetrates the nitride-containing regions 112A without penetrating the oxide-containing region 112B.

In the methods of manufacturing the semiconductor structure 10 with reference to FIGS. 1A-1J and the semiconductor structure 20 with reference to FIGS. 3A-3B, during the formation of the metal-containing layer 112, the nitride-containing regions 112A are formed earlier than the oxide-containing region 112B. However, the disclosure is not limited thereto. Hereinafter, other embodiments will be described with reference to FIGS. 4A-4D.

FIG. 4A to FIG. 4D are schematic cross-sectional views of various stages in a manufacturing method of a semiconductor structure 30 in accordance with some alternative embodiments of the present disclosure. The elements similar to or substantially the same as the elements described previously will use the same reference numbers, certain details or descriptions (e.g. the materials, formation processes, positioning configurations, etc.) of the same or similar elements would not be repeated herein, and differences between the embodiments with reference to FIGS. 4A-4D and the embodiments described previously will be described below.

Figure 4A:
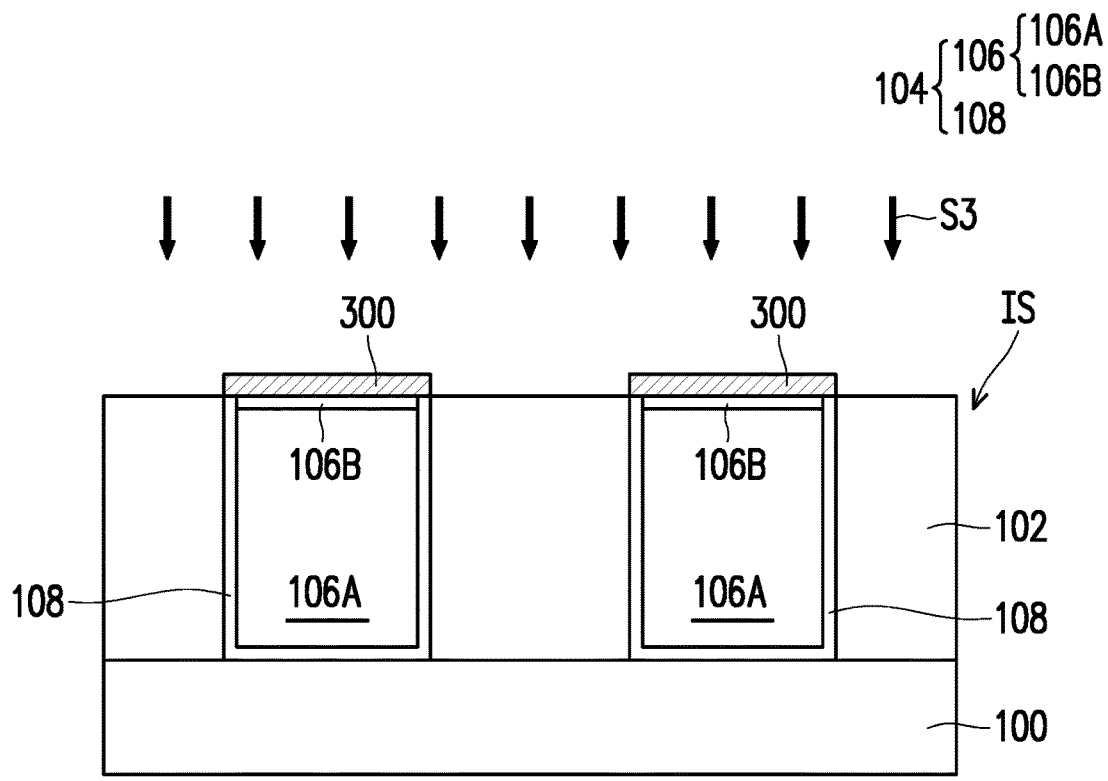
FIG. 4A to FIG. 4D are schematic cross-sectional views of various stages in a manufacturing method of a semiconductor structure in accordance with some alternative embodiments of the present disclosure.

Referring to FIG. 4A, a structure same as the structure of FIG. 1A is provided. Details or descriptions (e.g. the materials, formation processes, positioning configurations, etc.) of the substrate 100, the dielectric layer 102 and the conductive layer structure 104 have been described in conjunction with FIG. 1A and FIG. 2A above, and will not be iterated herein again. Accordingly, for details or descriptions of the substrate 100, the dielectric layer 102 and the conductive layer structure 104 not iterated herein, please refer to the aforesaid embodiments.

Continued on FIG. 4A, a surface treatment process S3 is performed to form multiple masking patterns 300 on the illustrated top surfaces of the conductive features 106. In some embodiments, the masking pattern 300 includes a material having high reactivity with metal materials. Examples of the said material of the masking pattern 300 include a phosphonic acid compound, such as an alkyl phosphonic acid compound having the total carbon atom of from 1 to 20, or an aryl phosphonic acid compound having the total carbon atom of from 1 to 25. That is to say, during the surface treatment process S3, compared with the top surface of the dielectric layer 102, the top surfaces of the conductive features 106 are highly prone to react and bond with the masking patterns 300. In other words, the surface treatment process S3 is used to selectively cover up the illustrated top surfaces of the conductive features 106 without covering the top surface of the dielectric layer 102. From another point of view, as shown in FIG. 4A, the masking patterns 300 are in direct contact with the conductive features 106. Since the conductive features 106 are separated from each other, the masking patterns 300 formed corresponding to the conductive features 106 are separated from each other.

In some embodiments that the conductive layer structure 104 includes the conductive features 106 and the barrier layers 108, since the barrier layers 108 include metal materials and/or metal nitride materials, during the surface treatment process S3, the illustrated top surfaces of the barrier layers 108 may also be highly prone to react and bond with the masking patterns 300. Accordingly, after the surface treatment process S3 is performed, the top surfaces of the barrier layers 108 are covered up by the masking patterns 300. That is to say, the masking patterns 300 may directly cover the conductive features 106 and the barrier layers 108 without covering the dielectric layer 102, as shown in FIG. 4A.

Figure 4B:
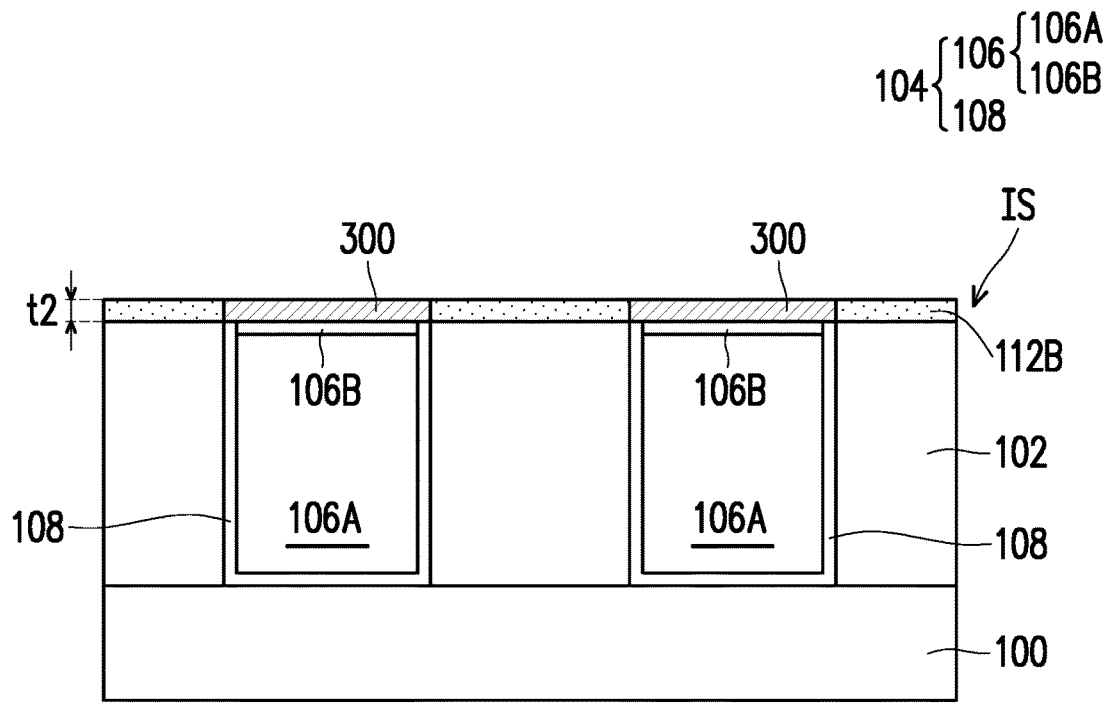

Referring to FIG. 4B, an oxide-containing region 112B is formed over the dielectric layer 102. In some embodiments, the oxide-containing region 112B covers the illustrated top surface of the dielectric layer 102 and surrounds the masking patterns 300. That is to say, the oxide-containing region 112B is selectively formed on the illustrated top surface of the dielectric layer 102. Details or descriptions (e.g. the materials, formation processes, positioning configurations, etc.) of the oxide-containing region 112B have been described in conjunction with FIG. 1C and FIG. 2C above, and will not be iterated herein again. Accordingly, for details or descriptions of the oxide-containing region 112B not iterated herein, please refer to the aforesaid embodiments.

Figure 4C:
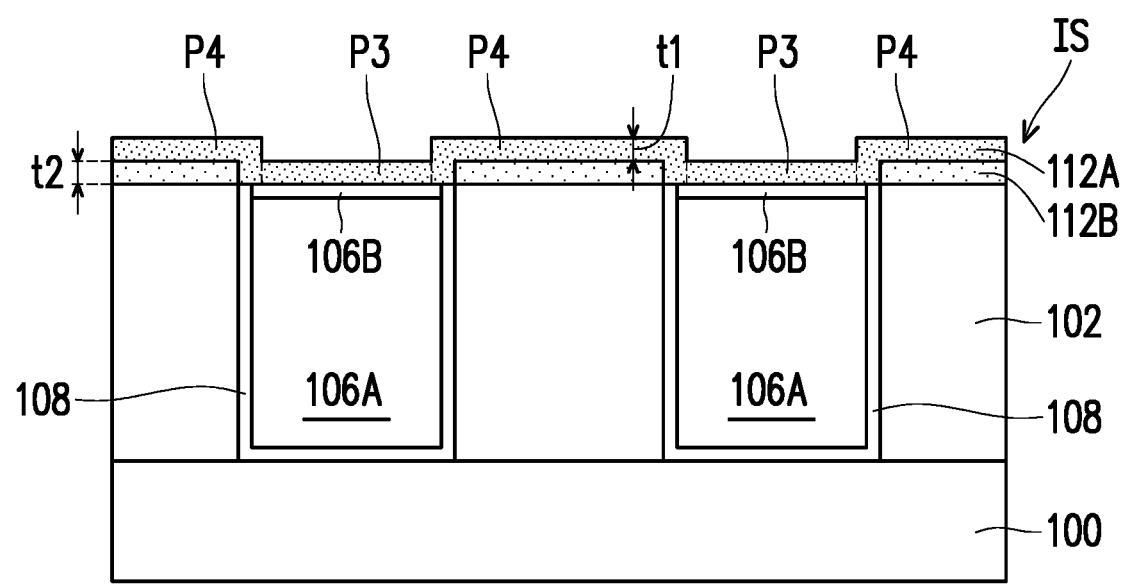

Referring to FIG. 4C, a nitride-containing region 112A is formed over the dielectric layer 102 and the oxide-containing region 112B to render a metal-containing layer 112. In some embodiments, as shown in FIG. 4C, the nitride-containing region 112A of the metal-containing layer 112 includes a first portion P3 and a second portion P4 connecting with the first portion P3, the first portion P3 is located on and contacts the conductive features 106, and the second portion P4 covers the oxide-containing region 112B. That is to say, the nitride-containing region 112A in the semiconductor structure 30 is globally formed over the substrate 100, but not selectively formed over the substrate 100. In other words, the nitride-containing region 112A is formed without performing the surface treatment process S1, which is beneficial to significantly enhance the reactivity between the nitride-containing region 112A and the top surfaces of the conductive features 106, in advance. From another point of view, in the direction Z, the thickness of the metal-containing layer 112 that is located on and contacts the dielectric layer 102 is greater than the thickness of the metal-containing layer 112 that is located on and contacts the conductive features 106. For example, the thickness of the metal-containing layer 112 that is located on and contacts the dielectric layer 102 is the sum of the thickness t1 of the nitride-containing region 112A and the thickness t2 of the oxide-containing region 112B, and the thickness of the metal-containing layer 112 that is located on and contacts the conductive features 106 is the thickness t1 of the nitride-containing region 112A. In some embodiments, the nitride-containing region 112A in the semiconductor structure 30 may be formed as a conformal layer or a non-conformal layer. Details or descriptions (e.g. the materials, formation processes, etc.) of the nitride-containing region 112A and the metal-containing layer 112 have been described in conjunction with FIGS. 1B-1C and FIGS. 2B-2C above, and will not be iterated herein again. Accordingly, for details or descriptions of the nitride-containing region 112A and the metal-containing layer 112 not iterated herein, please refer to the aforesaid embodiments.

Figure 4D:
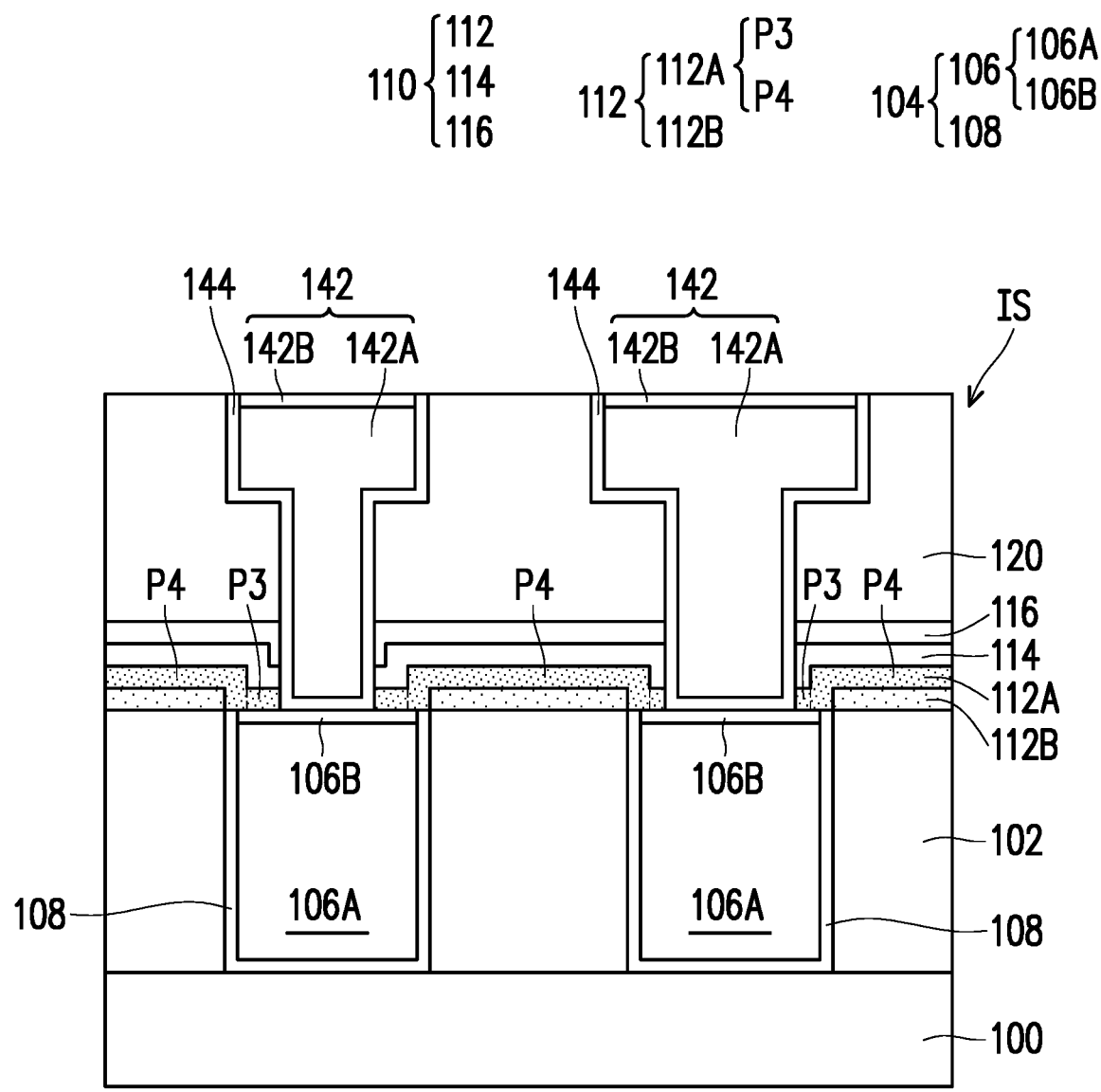

Referring to FIG. 4D, the semiconductor structure 30 including the substrate 100, the dielectric layer 102 over the substrate 100, the conductive features 106 in the dielectric layer 102, a new and improved etch stop layer 110 that includes the metal-containing layer 112 having the oxide-containing region 112B contacting the dielectric layer 102 and the nitride-containing region 112A contacting the conductive features 106 and the oxide-containing region 112B, a dielectric layer 120 over the etch stop layer 110, and a conductive layer structure 140 penetrating the dielectric layer 120 and the etch stop layer 110 and electrically connecting with the conductive features 106 is formed.

Details or descriptions (e.g. the materials, formation processes, positioning configurations, etc.) of the etch stop layer 110, the dielectric layer 120 and the conductive layer structure 140 have been described in conjunction with FIGS. 1D-1J above, and will not be iterated herein again. Accordingly, for details or descriptions of the etch stop layer 110, the dielectric layer 120 and the conductive layer structure 140 not iterated herein, please refer to the aforesaid embodiments. Further, referring to FIG. 4C and FIG. 1J, the semiconductor structure 30 illustrated in FIG. 4C is similar to the semiconductor structure 10 illustrated in FIG. 1J, and the difference between them lies in that: in the semiconductor structure 30, the nitride-containing region 112A covers the illustrated top surfaces of the conductive features 106 and the illustrated top surface of the oxide-containing region 112B; while in the semiconductor structure 10, the nitride-containing regions 112A cover the illustrated top surfaces of the conductive features 106 without covering the illustrated top surface of the oxide-containing region 112B and are surrounded by the oxide-containing region 112B.

In the methods of manufacturing the semiconductor structure 10 with reference to FIGS. 1A-1J, the semiconductor structure 20 with reference to FIGS. 3A-3B and the semiconductor structure 30 with reference to FIGS. 4A-4D, during the formation of the metal-containing layer 112, at least one of the nitride-containing region 112A and the oxide-containing region 112B is selectively formed over the substrate 100. However, the disclosure is not limited thereto. Hereinafter, other embodiments will be described with reference to FIGS. 5A-5B and FIG. 6.

Figure 5A:
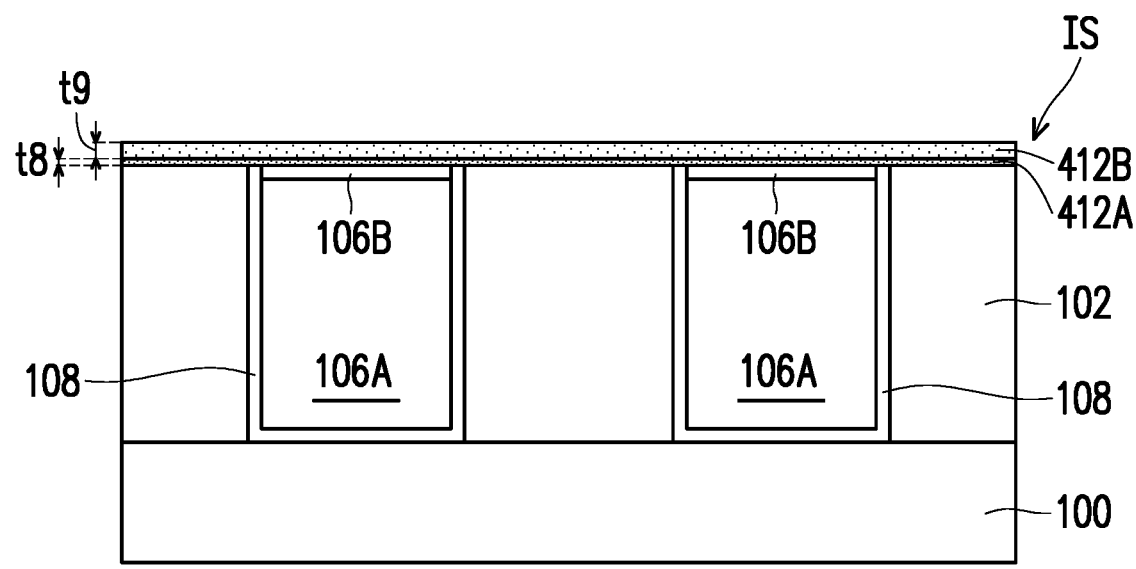
FIG. 5A to FIG. 5B are schematic cross-sectional views of various stages in a manufacturing method of a semiconductor structure in accordance with some alternative embodiments of the present disclosure.
Figure 5B:
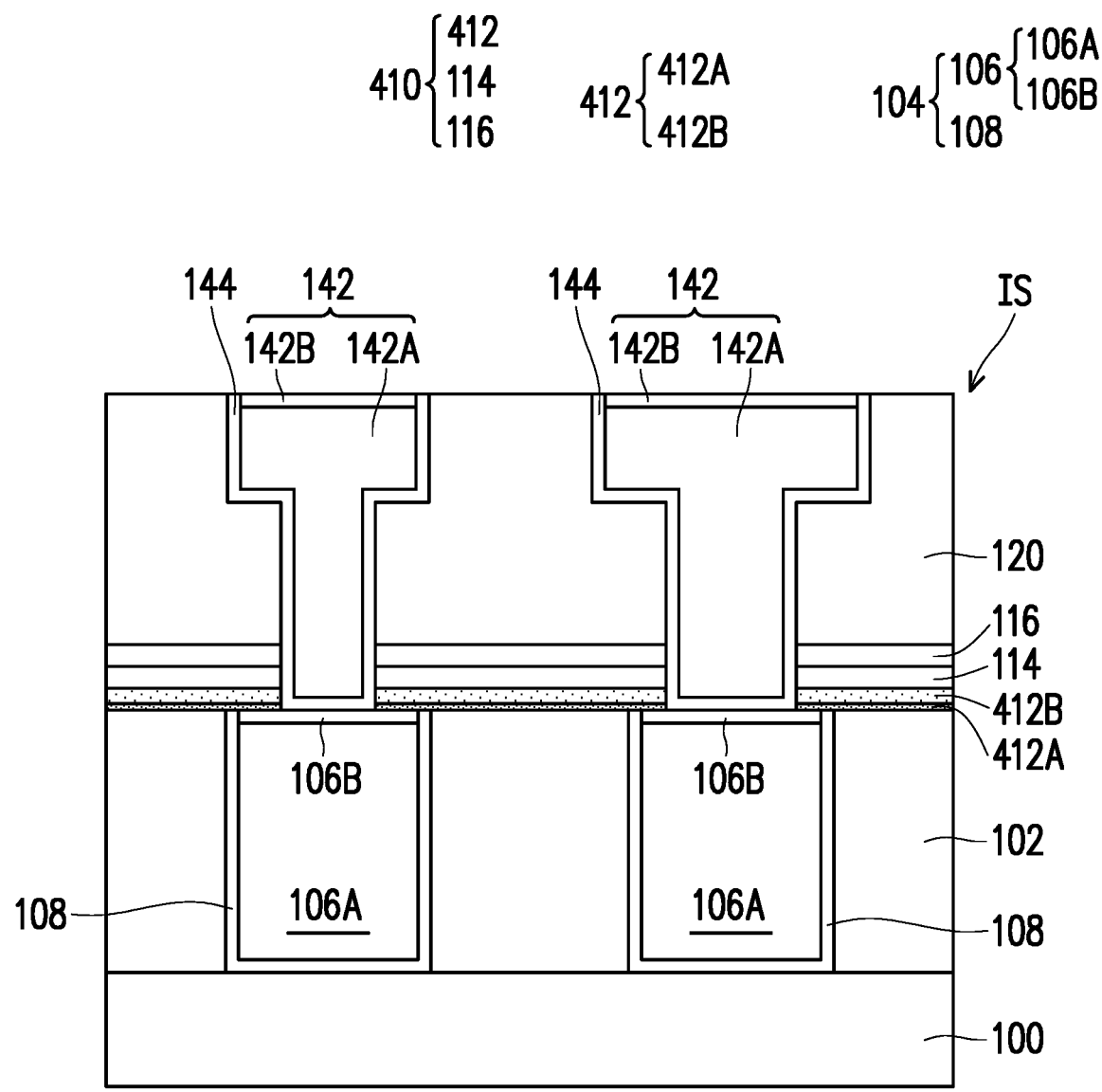

FIG. 5A to FIG. 5B are schematic cross-sectional views of various stages in a manufacturing method of a semiconductor structure 40 in accordance with some alternative embodiments of the present disclosure. The elements similar to or substantially the same as the elements described previously will use the same reference numbers, certain details or descriptions (e.g. the materials, formation processes, positioning configurations, etc.) of the same or similar elements would not be repeated herein, and differences between the embodiments with reference to FIGS. 5A-5B and the embodiments described previously will be described below.

Referring to FIG. 5A, a structure same as the structure of FIG. 1A is provided. Details or descriptions (e.g. the materials, formation processes, positioning configurations, etc.) of the substrate 100, the dielectric layer 102 and the conductive layer structure 104 have been described in conjunction with FIG. 1A and FIG. 2A above, and will not be iterated herein again. Accordingly, for details or descriptions of the substrate 100, the dielectric layer 102 and the conductive layer structure 104 not iterated herein, please refer to the aforesaid embodiments.

Continued on FIG. 5A, a nitride-containing region 412A and an oxide-containing region 412B are sequentially formed over the dielectric layer 102 and the conductive features 106 to render a metal-containing layer 412. In some embodiments, the nitride-containing region 412A of the metal-containing layer 412 covers the dielectric layer 102 and the conductive features 106. That is to say, the nitride-containing region 412A is globally formed over the substrate 100, but not selectively formed over the substrate 100. In some embodiments, the nitride-containing region 412A of the metal-containing layer 412 directly contacts the dielectric layer 102 and the conductive features 106, as shown in FIG. 5A. Furthermore, in the case that the conductive layer structure 104 includes the barrier layers 108, the nitride-containing region 412A of the metal-containing layer 412 also directly contacts the barrier layers 108, as shown in FIG. 5A. In some embodiments, the oxide-containing region 412B of the metal-containing layer 412 covers the dielectric layer 102 and the conductive features 106, and is separated from the dielectric layer 102 and the conductive features 106 by the nitride-containing region 412A. That is to say, along the direction Z, the oxide-containing region 412B is overlapped with the dielectric layer 102 and the conductive features 106 without contacting the dielectric layer 102 and the conductive features 106. In other words, the oxide-containing region 412B is globally formed to be stacked on the nitride-containing region 412A in the direction Z. In some embodiments, the nitride-containing region 412A may be formed as a conformal layer or a non-conformal layer, and the oxide-containing region 412B may be formed as a conformal layer or a non-conformal layer.

In some embodiments, the material of the nitride-containing region 412A is similar to the material of the nitride-containing region 112A described previously, thereby the detailed description of the material of the nitride-containing region 412A will be omitted herein. Also, the material of the oxide-containing region 412B is similar to the material of the oxide-containing region 112B described previously, thereby the detailed description of the material of the oxide-containing region 412B will be omitted herein.

In some embodiments, the nitride-containing region 412A and the oxide-containing region 412B may be formed by suitable deposition techniques such as PVD, CVD, PECVD, MOCVD, ALD, PEALD or plating (e.g., electroplating or electro-less plating). In certain embodiments, the nitride-containing region 412A and the oxide-containing region 412B may respectively be formed by the similar method as discussed above with respect to the nitride-containing region 112A and the oxide-containing region 112B. That is to say, the nitride-containing region 412A and the oxide-containing region 412B may be directly formed by suitable deposition techniques, or may be formed by the following steps: forming a metal layer first; and then performing a plasma treatment over the metal layer. In some embodiments, the nitride-containing region 412A and the oxide-containing region 412B are respectively formed in a chamber with a process temperature ranging from room temperature to about 600° C. and at a process pressure ranging from 0 to about 100 torr. In some embodiments, the nitride-containing region 412A and the oxide-containing region 412B may be deposited in the same process chamber. In some alternative embodiments, the nitride-containing region 412A and the oxide-containing region 412B may be deposited in different process chambers.

In some embodiments, in the direction Z, the thickness t8 of the nitride-containing regions 412A ranges from about 1 Å to about 50 Å, and the thickness t9 of the oxide-containing region 412B ranges from about 1 Å to about 50 Å. In some embodiments, a ratio of the thickness t8 of the nitride-containing region 412A to the thickness of the metal-containing layer 412 (i.e., the sum of the thickness t8 of the nitride-containing region 412A and the thickness t9 of the oxide-containing region 412B) ranges from about 1:0.1 to about 1:100. In some embodiments, a ratio of the thickness t8 of the nitride-containing region 412A to the thickness of the etch stop layer 412 (described hereinafter) ranges from about 1:0.1 to about 1:100. It is noted that the thickness t8 of the nitride-containing regions 412A and the thickness t9 of the oxide-containing region 412B are controlled to achieve a balance between surface topography requirements of the wirings and electrical reliability requirements for the subsequently formed semiconductor structure 40 and the subsequently formed device including the semiconductor structure 40. This is because the oxide-containing region 112B that can contribute to reduce the leakage current between the closely adjacent conductive features 106 is separated from the dielectric layer 102 and the conductive features 106 by the nitride-containing region 412A, and the nitride-containing region 412A contacting the conductive features 106 can contribute to prevent or greatly suppress the formation of pits in the conductive features 106 under the HPA process. As such, by including the nitride-containing region 412A and the oxide-containing region 412B over the nitride-containing region 412A in the metal-containing layer 412, the performance, yield and reliability of the subsequently formed semiconductor structure 40 and the subsequently formed device including the semiconductor structure 40 can be improved. In some embodiments, the amount of the pits formed in the conductive features 106 under the HPA process can be significantly reduced by at least 95%. In some embodiment, the TDDB characteristic and the VBD characteristic of the subsequently formed semiconductor structure 40 and/or the subsequently formed device including the semiconductor structure 40 are improved by about 1.5 times to about 100 times.

Referring to FIG. 5B, the semiconductor structure 40 including the substrate 100, the dielectric layer 102 over the substrate 100, the conductive features 106 in the dielectric layer 102, a new and improved etch stop layer 410 that includes the metal-containing layer 412 having the nitride-containing region 412A covering the conductive features 106 and the oxide-containing region 412B covering the dielectric layer 102 and stacked over the nitride-containing region 412A, a dielectric layer 120 over the etch stop layer 410, and a conductive layer structure 140 penetrating the dielectric layer 120 and the etch stop layer 410 and electrically connecting with the conductive features 106 is formed. Referring to FIG. 5B and FIG. 1J, the etch stop layer 410 illustrated in FIG. 5B is similar to the etch stop layer 110 illustrated in FIG. 1J, except that the etch stop layer 410 includes the metal-containing layer 412 while the etch stop layer 110 includes the metal-containing layer 112. As such, the etch stop layer 410 includes the metal-containing layer 412, a silicon-containing layer 114 and a metal-containing layer 116, wherein the silicon-containing layer 114 is located between the metal-containing layer 412 and the metal-containing layer 116. That is to say, the etch stop layer 410 includes three sub-layers. However, the disclosure is not limited thereto. In some alternative embodiments, the etch stop layer 410 may include two sub-layers. For example, in an embodiment, the etch stop layer 410 may include the metal-containing layer 412 and the silicon-containing layer 114. Details or descriptions (e.g. the materials, formation processes, positioning configurations, etc.) of the silicon-containing layer 114, the metal-containing layer 116, the dielectric layer 120 and the conductive layer structure 140 have been described in conjunction with FIGS. 1D-1J above, and will not be iterated herein again. Accordingly, for details or descriptions of the silicon-containing layer 114, the metal-containing layer 116, the dielectric layer 120 and the conductive layer structure 140 not iterated herein, please refer to the aforesaid embodiments.

Further, referring to FIG. 5B and FIG. 1J, the semiconductor structure 40 illustrated in FIG. 5B is similar to the semiconductor structure 10 illustrated in FIG. 1J, and the differences between them lie in that: in the semiconductor structure 40, the metal-containing layer 412 of the etch stop layer 410 includes the nitride-containing region 412A contacting both the conductive features 106 and the dielectric layer 102 and the oxide-containing region 412B stacked over the nitride-containing region 412A, and the conductive layer structure 140 penetrates both the nitride-containing region 412A and the oxide-containing region 412B of the metal-containing layer 412; while in the semiconductor structure 10, the metal-containing layer 112 of the etch stop layer 110 includes the nitride-containing regions 112A contacting the conductive features 106 and the oxide-containing region 112B contacting the dielectric layer 102, and the conductive layer structure 140 penetrates the nitride-containing regions 112A of the metal-containing layer 112 without penetrating the oxide-containing region 112B of the metal-containing layer 112.

In the method of manufacturing the semiconductor structure 40 with reference to FIGS. 5A-5B, the metal-containing layer 412 of the etch stop layer 410 includes one nitride-containing region 412A and one oxide-containing region 412B stacked over the said nitride-containing region 412A. However, the disclosure is not limited thereto. In some alternative embodiments, the metal-containing layer 412 of the etch stop layer 410 may include multiple nitride-containing regions 412A and multiple oxide-containing regions 412B stacked alternately. Hereinafter, other embodiments will be described with reference to FIG. 6.

Figure 6:
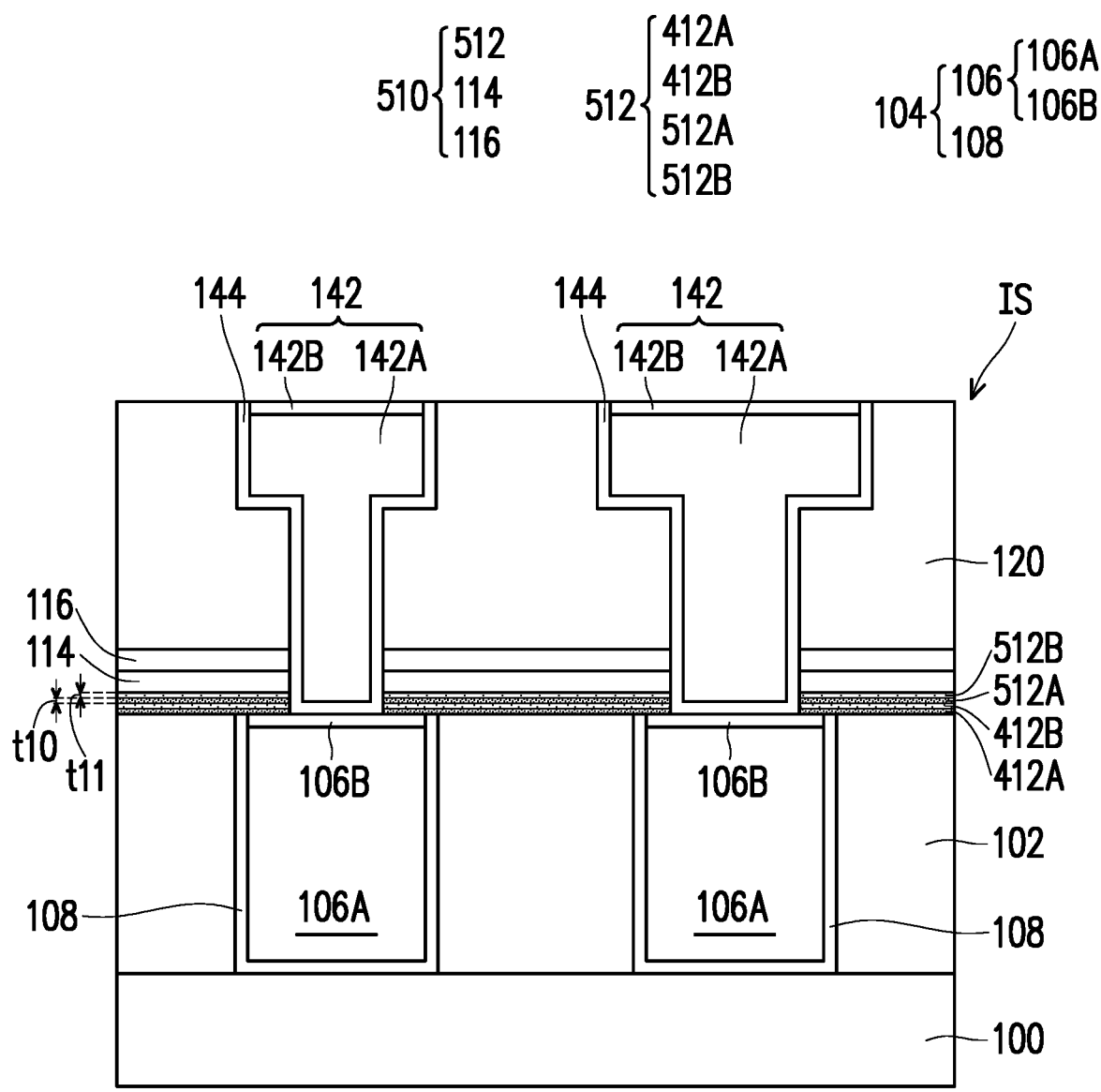
FIG. 6 is schematic cross-sectional view of a semiconductor structure in accordance with some alternative embodiments of the present disclosure.

FIG. 6 is schematic cross-sectional view of a semiconductor structure 50 in accordance with some alternative embodiments of the present disclosure. Referring to FIG. 6 and FIG. 5B, the semiconductor structure 50 shown in FIG. 6 is similar to the semiconductor structure 40 shown in FIG. 5B, hence the same reference numerals are used to refer to the same or similar elements, and its detailed description will be omitted herein. The differences between the semiconductor structure 50 shown in FIG. 6 and the semiconductor structure 40 shown in FIG. 5B will be described below.

Referring to FIG. 6, an etch stop layer 510 of the semiconductor structure 50 includes a metal-containing layer 512, wherein the metal-containing layer 512 includes a nitride-containing region 412A, an oxide-containing region 412B, a nitride-containing region 512A, and an oxide-containing region 512B. Details or descriptions (e.g. the materials, formation processes, positioning configurations, etc.) of the nitride-containing region 412A and the oxide-containing region 412B have been described in conjunction with FIG. 5A above, and will not be iterated herein again. Accordingly, for details or descriptions of the nitride-containing region 412A and the oxide-containing region 412B not iterated herein, please refer to the aforesaid embodiments. In some embodiments, the nitride-containing region 512A is disposed over the oxide-containing region 412B, and the oxide-containing region 512B is disposed over the nitride-containing region 512A. Accordingly, the nitride-containing region 512A is also referred to as an overlying nitride-containing region, and the oxide-containing region 512B is also referred to as an overlying oxide-containing region through the description of the disclosure. From another point of view, as shown in FIG. 6, the nitride-containing regions 412A, 512A and the oxide-containing regions 412B, 512B are stacked alternately over the dielectric layer 102 and the conductive features 106. The numbers of the nitride-containing region 512A and the oxide-containing region 512B may be more than what is depicted in FIG. 6, and may be designated based on the demand and/or design layout; the disclosure is not specifically limited thereto.

In some embodiments, the material of the nitride-containing region 512A is similar to the material of the nitride-containing region 412A described previously, thereby the detailed description of the material of the nitride-containing region 512A will be omitted herein. Also, the material of the oxide-containing region 512B is similar to the material of the oxide-containing region 412B described previously, thereby the detailed description of the material of the oxide-containing region 512B will be omitted herein. In some embodiments, the nitride-containing region 512A may include the same material as the nitride-containing region 412A. In some alternative embodiments, the materials of the nitride-containing region 512A and the nitride-containing region 412A may be different. Similarly, in some embodiments, the oxide-containing region 512B may include the same material as the oxide-containing region 412B; and in some alternative embodiments, the materials of the oxide-containing region 512B and the oxide-containing region 412B may be different.

In some embodiments, the method of forming the nitride-containing region 512A is similar to the method of forming the nitride-containing region 412A described previously, thereby the detailed description of the method of forming the nitride-containing region 512A will be omitted herein. Also, the method of forming the oxide-containing region 512B is similar to the method of forming the oxide-containing region 412B described previously, thereby the detailed description of the method of forming the oxide-containing region 512B will be omitted herein. In some embodiments, in the direction Z, the thickness t10 of the nitride-containing regions 512A ranges from about 1 Å to about 50 Å, and the thickness t11 of the oxide-containing region 512B ranges from about 1 Å to about 50 Å.

In accordance with some embodiments of the disclosure, a semiconductor structure including a substrate, a first dielectric layer, a first conductive feature, an etch stop layer, a second dielectric layer and a second conductive feature is provided. The first dielectric layer is disposed over the substrate. The first conductive feature is disposed in the first dielectric layer. The etch stop layer is disposed over the first dielectric layer and the first conductive feature, wherein the etch stop layer comprises a metal-containing layer and a silicon-containing layer, the metal-containing layer is located between the first dielectric layer and the silicon-containing layer, the metal-containing layer comprises a nitride-containing region and an oxide-containing region, and the nitride-containing region contacts the first conductive feature. The second dielectric layer is disposed over the etch stop layer. The second conductive feature penetrates the second dielectric layer and electrically connects with the first conductive feature.

In accordance with some alternative embodiments of the disclosure, a semiconductor structure including a substrate and an interconnect structure is provided. The interconnect structure is disposed over the substrate, the interconnect structure comprises interlayer dielectric layers, an etch stop layer between two of the interlayer dielectric layers and conductive features embedded in the interlayer dielectric layers, wherein the etch stop layer comprises an insulating layer and a silicon-containing insulating layer over the insulating layer, the insulating layer comprises a metal oxide region covering at least one of the interlayer dielectric layers and at least one metal nitride region covering the conductive features.

In accordance with some alternative embodiments of the disclosure, a method of manufacturing a semiconductor structure including the following steps is provided. A substrate is provided. A first dielectric layer is formed over the substrate. The first conductive feature is formed in the first dielectric layer. The etch stop layer is formed over the first dielectric layer and the first conductive feature, wherein the etch stop layer comprises a metal-containing layer and a silicon-containing layer, the metal-containing layer is located between the first dielectric layer and the silicon-containing layer and between the first conductive feature and the silicon-containing layer, the metal-containing layer comprises a nitride-containing region and an oxide-containing region, and the nitride-containing region directly contacts the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a first dielectric layer disposed over the substrate;
    a first conductive feature disposed in the first dielectric layer;
    an etch stop layer disposed over the first dielectric layer and the first conductive feature, wherein the etch stop layer comprises a metal-containing layer comprising a nitride-containing region and an oxide-containing region, and the nitride-containing region contacts the first conductive feature; and
    a second conductive feature penetrating the nitride-containing region of the etch stop layer and electrically connecting with the first conductive feature.

2. The semiconductor structure according to claim 1, wherein the oxide-containing region contacts the first dielectric layer.

3. The semiconductor structure according to claim 2, wherein the nitride-containing region is surrounded by the oxide-containing region.

4. The semiconductor structure according to claim 2, wherein the oxide-containing region is covered by the nitride-containing region and located between the nitride-containing region and the first dielectric layer.

5. The semiconductor structure according to claim 4, wherein a thickness of the metal-containing layer that is located on and contacts the first dielectric layer is greater than a thickness of the metal-containing layer that is located on and contacts the first conductive feature.

6. The semiconductor structure according to claim 1, the nitride-containing region contacts the first dielectric layer, and the oxide-containing region is separated from the first dielectric layer by the nitride-containing region.

7. The semiconductor structure according to claim 6, wherein the metal-containing layer further comprises an overlying nitride-containing region and an overlying oxide-containing region, the overlying nitride-containing region is disposed over the oxide-containing region, and the overlying oxide-containing region is disposed over the overlying nitride-containing region.

8. A semiconductor structure, comprising:
    a substrate; and
    an interconnect structure disposed over the substrate, the interconnect structure comprising interlayer dielectric layers, an etch stop layer between two of the interlayer dielectric layers and conductive features embedded in the interlayer dielectric layers, wherein the etch stop layer comprises an insulating layer comprising a metal oxide region covering at least one of the interlayer dielectric layers and at least one metal nitride region covering the conductive features, and one of the conductive features penetrates the at least one metal nitride region.

9. The semiconductor structure according to claim 8, wherein the at least one metal nitride region covering the conductive features comprises multiple metal nitride regions separated from each other by the metal oxide region covering the at least one of the interlayer dielectric layers.

10. The semiconductor structure according to claim 8, wherein the at least one metal nitride region covering the conductive features comprises a first portion and a second portion connecting with the first portion, the first portion is located on and contacts the conductive features, and the second portion covers the metal oxide region covering the at least one of the interlayer dielectric layers.

11. The semiconductor structure according to claim 8, wherein the at least one metal nitride region covering the conductive features contacts the conductive features and the at least one of the interlayer dielectric layers, and the metal oxide region covering the at least one of the interlayer dielectric layers is stacked on the at least one metal nitride region covering the conductive features.

12. The semiconductor structure according to claim 11, wherein the at least one metal nitride region covering the conductive features has a thickness ranging from 1 Å to 50 Å, the metal oxide region covering the at least one of the interlayer dielectric layers has a thickness ranging from 1 Å to 50 Å.

13. The semiconductor structure according to claim 11, wherein a ratio of a thickness of the at least one metal nitride region covering the conductive features to a thickness of the insulating layer ranges from 1:0.1 to 1:100.

14. The semiconductor structure according to claim 8, wherein the etch stop layer further comprises a silicon-containing insulating layer over the insulating layer; and a metal-containing insulating layer over the silicon-containing insulating layer, the silicon-containing insulating layer has a thickness ranging from 3 Å to 150 Å, and the metal-containing insulating layer has a thickness ranging from about 3 Å to about 150 Å.

15. A method of manufacturing a semiconductor structure, comprising:
providing a substrate;
forming a first dielectric layer over the substrate;
forming a first conductive feature in the first dielectric layer;
forming an etch stop layer over the first dielectric layer and the first conductive feature, wherein the etch stop layer comprises a metal-containing layer comprising a nitride-containing region and an oxide-containing region, and the nitride-containing region contacts the first conductive feature; and
forming a second conductive feature penetrating the nitride-containing region and electrically connecting with the first conductive feature.

16. The method according to claim 15, wherein the oxide-containing region directly contacts the first dielectric layer, and the step of forming the etch stop layer comprises:
performing a first surface treatment process on a top surface of the first conductive feature;
forming the nitride-containing region on the treated top surface of the first conductive feature;
performing a second surface treatment process on a top surface of the first dielectric layer; and
forming the oxide-containing region on the treated top surface of the first dielectric layer.

17. The method according to claim 16, wherein each of the first surface treatment process and the second surface treatment process comprises a heat treatment process or a plasma treatment process.

18. The method according to claim 15, wherein the oxide-containing region directly contacts the first dielectric layer, and the step of forming the etch stop layer comprises:
performing a first surface treatment process to form a masking pattern on a top surface of the first conductive feature;
after forming the masking pattern, performing a second surface treatment process on a top surface of the first dielectric layer;
forming the oxide-containing region on the treated top surface of the first dielectric layer;
removing the masking pattern; and
forming the nitride-containing region on the top surface of the first conductive feature and to cover the oxide-containing region.

19. The method according to claim 15, wherein the step of forming the second conductive feature comprising:
forming a second dielectric layer over the etch-stop layer;
forming a mask layer on the second dielectric layer, wherein the mask layer comprises a first mask layer disposed on the second dielectric layer and a second mask layer disposed on the first mask layer;
etching the second dielectric layer by using the second mask layer as an etching mask to form an opening exposing a portion of the etch-stop layer;
removing the second mask layer;
etching the portion of the etch-stop layer to expose the first conductive feature; and
forming the second conductive feature in the opening and electrically connecting with the first conductive feature.

20. The method according to claim 19, wherein the second dielectric layer is etched by a dry etching process, the second mask layer is removed by a wet etching process, and the portion of the etch-stop layer is etched by a dry etching process.

* * * * *